（12) United States Patent
Nagai et al.

(10) Patent No.: US 12,032,286 B2
(45) Date of Patent: Jul. 9, 2024

(54) METHOD FOR PRODUCING MULTI-LAYERED TYPE MICROCHANNEL DEVICE USING PHOTOSENSITIVE RESIN LAMINATE

(71) Applicants: ASAHI KASEI KABUSHIKI KAISHA, Tokyo (JP); NATIONAL INSTITUTE OF ADVANCED INDUSTRIAL SCIENCE AND TECHNOLOGY, Tokyo (JP)

(72) Inventors: Hidenori Nagai, Ikeda (JP); Shunsuke Furutani, Ikeda (JP); Kanako Mizumura, Tokyo (JP); Yuzo Kotani, Tokyo (JP)

(73) Assignees: ASAHI KASEI KABUSHIKI KAISHA, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 595 days.

(21) Appl. No.: 16/902,962

(22) Filed: Jun. 16, 2020

(65) Prior Publication Data

US 2020/0393754 A1 Dec. 17, 2020

(30) Foreign Application Priority Data

Jun. 17, 2019 (JP) ................. 2019-111686

(51) Int. Cl.
*G03F 7/00* (2006.01)
*B01L 3/00* (2006.01)
*B81C 1/00* (2006.01)
*G03F 7/09* (2006.01)
*G03F 7/32* (2006.01)

(52) U.S. Cl.
CPC ...... *G03F 7/0035* (2013.01); *B01L 3/502707* (2013.01); *B81C 1/00071* (2013.01); *G03F 7/094* (2013.01); *G03F 7/32* (2013.01); *B81C 2201/0159* (2013.01)

(58) Field of Classification Search
CPC ...... G03F 7/0035; G03F 7/0037; G03F 7/094; G03F 7/322
See application file for complete search history.

(56) References Cited

U.S. PATENT DOCUMENTS

| | | | |
|---|---|---|---|
| 4,485,167 | A | 11/1984 | Briney et al. |
| 5,478,606 | A | 12/1995 | Ohkuma et al. |
| 2003/0096081 | A1 | 5/2003 | Lavallee et al. |
| 2003/0215753 | A1 | 11/2003 | Tseng et al. |
| 2006/0110907 | A1 | 5/2006 | Sakurai et al. |
| 2006/0153741 | A1 | 7/2006 | Yoshida |
| 2008/0213524 | A1 | 9/2008 | Yao et al. |
| 2008/0286152 | A1 | 11/2008 | Schmidt et al. |
| 2009/0035706 | A1 | 2/2009 | Honda et al. |
| 2013/0334579 | A1 | 12/2013 | Accardi et al. |
| 2014/0099243 | A1 | 4/2014 | Kotera et al. |
| 2015/0093838 | A1 | 4/2015 | Landers et al. |
| 2015/0301450 | A1 | 10/2015 | Imaizumi et al. |
| 2016/0136638 | A1 | 5/2016 | Hieda et al. |
| 2016/0310944 | A1 | 10/2016 | Nishimura et al. |
| 2016/0367988 | A1 | 12/2016 | Azpiroz et al. |

FOREIGN PATENT DOCUMENTS

| | | | | |
|---|---|---|---|---|
| JP | 57-96332 | A | 6/1982 | |
| JP | 06175360 | * | 6/1994 | ............ G03F 7/027 |
| JP | 6-286149 | A | 10/1994 | |
| JP | 2000-294900 | A | 10/2000 | |
| JP | 3288464 | B2 * | 6/2002 | ............... G03F 7/40 |
| JP | 2002-303971 | A | 10/2002 | |
| JP | 2002-365797 | A | 12/2002 | |
| JP | 2004-167607 | A | 6/2004 | |
| JP | 2006-114735 | A | 4/2006 | |
| JP | 2007-964 | A | 1/2007 | |
| JP | 2008-299165 | A | 12/2008 | |
| JP | 2009-15158 | A | 1/2009 | |

(Continued)

OTHER PUBLICATIONS

English Abstract of Japanese Patent Publication No. 06175360 (Year: 1994).*
English Translation of JP 3288464 (Year: 2002).*
Heuschkel et al., "Buried Microchannels in Photopolymer for Delivering of Solutions to Neurons in a Network," Sensors and Actuators B: Chemical, vol. 48, Issues 1-3, 1998 (May 30, 1998), pp. 356-361 (Total 8 pages).

(Continued)

*Primary Examiner* — Daborah Chacko-Davis
(74) *Attorney, Agent, or Firm* — Birch, Stewart, Kolasch & Birch, LLP (57) ABSTRACT

Provided is a method for producing a multi-layered microchannel device by using a photosensitive resin laminate, which is highly-defined and excellent in dimension accuracy and enables channels to be partially hydrophilized or hydrophobilized, wherein the method comprises step (i) of sequentially carrying out (i-a) forming a first photosensitive resin layer on a substrate, (i-b) light-exposing the first photosensitive resin layer, and (i-c) developing the light-exposed photosensitive layer and forming a channel pattern layer, to form a first channel pattern layer; and step (ii) of sequentially carrying out (ii-a) laminating a second photosensitive resin laminate on the first channel pattern layer formed in the step (i), (ii-b) light-exposing a photosensitive layer of the second photosensitive resin laminate, and (ii-c) developing the light-exposed photosensitive layer and forming a channel pattern layer, to form a second channel pattern layer.

23 Claims, 1 Drawing Sheet

(56) References Cited

FOREIGN PATENT DOCUMENTS

| JP | 2009-31344 A | 2/2009 | | |
|---|---|---|---|---|
| JP | 2009-48170 A | 3/2009 | | |
| JP | 2009-295797 A | 12/2009 | | |
| JP | 2010-61085 A | 3/2010 | | |
| JP | 4691047 B2 | 6/2011 | | |
| JP | 2014-85626 A | 5/2014 | | |
| JP | 2014-210865 A | 11/2014 | | |
| JP | 5700547 B2 | 4/2015 | | |
| JP | 2016-529116 A | 9/2016 | | |
| JP | 2017-119340 A | 7/2017 | | |
| WO | WO 2005/079330 A2 | 9/2005 | | |
| WO | WO 2014/207619 A1 | 12/2014 | | |
| WO | WO 2015/012212 A1 | 1/2015 | | |
| WO | WO 2018/163101 A1 | 9/2018 | | |
| WO | WO2018/169416 | * | 9/2018 | ............. H01L 21/67 |

OTHER PUBLICATIONS

Tseng et al., "A Novel Fabrication Method of Embedded Micro Channels Employing Simple UV Dosage Control and Antireflection Coating," MEMS 2002 IEEE International Conference. Fifteenth IEEE International Conference on Micro Electro Mechanical Systems, Aug. 7, 2002, pp. 69-72.

* cited by examiner

METHOD FOR PRODUCING MULTI-LAYERED TYPE MICROCHANNEL DEVICE USING PHOTOSENSITIVE RESIN LAMINATE

TECHNICAL FIELD

The present invention relates to a method for producing a multi-layered type microchannel device by using a photosensitive resin laminate.

BACKGROUND ART

In general, a microchannel device is a generic term of devices in which a small channel, valve, fluid introduction port, discharge port, reaction vessel, etc., are fabricated in a substrate by using micro processing technologies such as microelectromechanical device system (MEMS) technology, etc., based on microfluidics, and the fabricated channels, etc., are applied for biotechnology research, drug discovery, diagnosis, inspection or chemical engineering. The microchannel devices are also called as a micro fluidic device, micro fluidic chip, μTAS (Micro Total Analysis Systems), LOC (Lab on a Chip), micro reactor, etc. In recent years, there has been growing interest in the microchannel devices from the viewpoint of chronic disease, shortage of doctors, home health care, remote medicine or point of care testing (POCT).

The microchannel devices have been conventionally produced by injection molding, molding and glass etching, however, instead thereof, there has been proposed a method for forming a resin pattern for a channel on a base material by lithography followed by joining a lid member (sealing material) (the following Patent Literatures 1 to 4).

Patent Literature 1 discloses, for example, a highly defined pattern having a high aspect ratio, wherein the pattern can be formed with ease by using a photosensitive resin composition comprising an epoxy compound having a specific structure including an alicyclic structure (A), a photo cationic polymerization initiator (B), and a solvent (C), and has high adhesiveness with a substrate and a low autofluorescence property, which is extremely suitable for producing a biochip, and Patent Literature 1 also refers to a biochip obtained by laminating a dry film obtained from the photosensitive resin composition.

Patent Literature 2 discloses a perpetual photoresist composition comprising a bisphenol A novolac epoxy resin (A) such as an EPON (registered trademark) SU-8 type resin, etc., an epoxy resin (B) different from the resin (A), a photo acid generator and a solvent with an aim to improve a resolution, thermal stability, chemical resistance, and solvency property as well as performances with respect to adhesiveness, interlayer delamination, cracking, crazing, stress, and flexibility, of a channel pattern or partition, and an attempt has been made to obtain a dry film from the perpetual photo resist composition in Example 32 of the literature.

Patent Literature 3 discloses a 20 μm thick dry film of DuPont PerMX3020 (product name) and a DF-1050 (product name) dry film with approximately 50 μm thickness as a sealing material (cover film), manufactured by Engineered Material Systems Inc. (EMS), both of which are used in forming a microchannel by photolithography, and also refers to a SU-8 type resin-containing film.

Patent Literature 4 discloses a production method of a micro fluidic apparatus, wherein the production method comprises a step of forming a resin layer on a support from a photosensitive resin composition having a specific constitution, step of exposure to ultraviolet light and development of a portion of the resin layer, step of obtaining a laminate by disposing a lid member on the resin layer after the development, and step of exposure to ultraviolet light of the obtained laminate, and PTL 4 describes that the aforementioned method enables to manufacture a micro fluidic apparatus having favorable channels, etc., since patterned resin layers following the lithography have sufficient strength and tackiness.

CITATION LIST

Patent Literature

[Patent Literature 1] Japanese Patent No. 5700547
[Patent Literature 2] Japanese Patent No. 4691047
[Patent Literature 3] Japanese Translation of PCT International Application Publication No. 2016-529116
[Patent Literature 4] Japanese Unexamined Patent Publication No. 2017-119340

SUMMARY OF INVENTION

Technical Problem

The microchannel device is utilized for analysis of a trace amount of substance and chemical reactions, etc., in the aforementioned applications, and fluids (liquid or gas) suitable for each application are introduced into microchannels. When structural members (for example, a partition member and sealing material) contacting fluid have poor resistance (for example, water resistance with respect to aqueous fluid) to the fluid in the microchannels and these structural members swell by the fluid or the fluid is absorbed to the structural members, flowability of the fluid in the microchannels cannot be ensured as intended, which impairs accuracies of analysis, chemical reactions, etc. In the case of using a photosensitive resin laminate (also referred to as dry film resist or dry film photoresist) having a support film and a photosensitive resin composition layer, since characteristic properties (water resistance, resistance to organic solvent, mechanical property, etc.) of the structural members can be easily designed by changing the composition of the photosensitive resin composition, therefore chemical analysis, chemical reactions, etc., can be accurately carried out by appropriately controlling resistance to fluids according to applications. Moreover, since the photosensitive laminate can be subjected to pattern light-exposure, structural members excellent in dimension accuracy can be formed without using metal molds, etc., as essentials (i.e., with fewer equipment and less cost).

Microchannel devices include, for example, a POCT kit, ELISA device, microreactor, cooler for electronic devices, etc. Among these, a compact disc type μTAS (hereinafter referred to as "CD type ELISA device") which is suitable for centrifugal liquid delivery without using a pump, has been developed in terms of enabling simple inspection on a spot such as on site or at one's bedside. ELISA is an analytical method used in blood inspection utilizing an antigen-antibody reaction and an accurate weighing technique for weighing a trace amount is required in order to attain high sensitivity and acceleration. Moreover, the CD type ELISA device has an external form analogous to a compact disc as seen in planar view, and is a miniature analyzer provided with a body in which fluid is subjected to analysis; at least one liquid tank storing fluid; at least one analytical section where the fluid is detected, reacted, adsorbed, desorbed, or decomposed for ELISA analysis; and at least one channel that connects the liquid tank and the analytical section and flows fluid therebetween. Since the method of fluid delivery is a method for rotating and delivering fluid with the help of centrifuge from the center toward the outside of the diameter direction, the fluid delivery is significantly affected and controlled by the balance of forces derived from capillary phenomena occurred at each tank and channels connecting each tank and the centrifugal forces thereof, which has caused problems in controlling the fluid flow and accurately weighing a trace amount, etc. In order to control the fluid flow introduced inside a channel, it is necessary to partially hydrophilize or hydrophobilize the channel.

As previously described in Patent Literatures 2 and 3, the microchannel is, for example, formed by patterning the dry film obtained from the photosensitive resin composition, however, the single photosensitive resin composition was used and the properties throughout the channels are assumed to be the same in terms of wettability (contact angle, interface energy).

Moreover, as previously described, Patent Literature 1 describes that after the photosensitive resin layer which was formed by coating the surface of the substrate with the liquefied photosensitive resin composition, was subjected to patterning, the dry film obtained from the photosensitive resin composition was laminated on the patterns and then subjected to patterning, however, there is no detailed description therefor. Moreover, the manufacturing steps become complicated in terms of forming a liquefied photosensitive resin composition and dry film obtained therefrom.

In light of BACKGROUND ART, a problem to be solved by the present invention is to provide a method for producing a multi-layered type microchannel device by using a photosensitive resin laminate, which is highly-defined and excellent in dimension accuracy and also enables channels to be partially hydrophilized or hydrophobilized.

Solution to Problem

The present inventors have conducted diligent experimentation with the aim of solving the problems described above. As a result, the present inventors unexpectedly have found that the aforementioned problem can be solved by patterning using a plurality of mutually different photosensitive resin compositions and thus have completed the present invention.

Namely, the present invention is as follows.

[1]
A method for producing a microchannel device comprising:
(i) a step of sequentially carrying out step (i-a) of forming a first photosensitive resin layer on a substrate; step (i-b) of light-exposing the first photosensitive resin layer, and step (i-c) of developing the light-exposed photosensitive layer and forming a channel pattern layer, to form a first channel pattern layer; and
(ii) a step of sequentially carrying out step (ii-a) of laminating a second photosensitive resin laminate on the first channel pattern layer formed in the step (i); step (ii-b) of light-exposing a photosensitive layer of the second photosensitive resin laminate; and step (ii-c) of developing the light-exposed photosensitive layer and forming a channel pattern layer, to form a second channel pattern layer.

[2]
The method for producing a microchannel device according to [1], wherein the first photosensitive resin layer is formed by laminating a photosensitive resin laminate in the step (i-a).

[3]
The method for producing a microchannel device according to [1] or [2], wherein the second channel pattern layer is different from the first channel pattern layer in terms of wettability.

[4]
The method for producing a microchannel device according to any one of [1] to [3], further comprising:
(iii) a step of sequentially carrying out step (iii-a) of laminating a third photosensitive resin laminate on the second channel pattern layer formed in the step (ii); step (iii-b) of light-exposing a photosensitive layer of the third photosensitive resin laminate; and step (iii-c) of developing the light-exposed photosensitive layer and forming a channel pattern layer, to form a third channel pattern layer.

[5]
The method for producing a microchannel device according to [4], wherein the third channel pattern layer is different from the second channel pattern layer in terms of wettability.

[6]
The method for producing a microchannel device according to [4] or [5], further comprising:
(n) repeated steps of sequentially carrying out step (n-a) of laminating a n-th photosensitive resin laminate on a (n−1)-th channel pattern layer wherein n is an integer of 4 or greater; step (n-b) of light-exposing a photosensitive layer of the n-th photosensitive resin laminate; and step (n-c) of developing the light-exposed photosensitive layer and forming a channel pattern layer, to form a n-th channel pattern layer.

[7]
The method for producing a microchannel device according to [6], wherein the n-th channel pattern layer is different from the (n−1)-th channel pattern layer in terms of wettability.

[8]
The method for producing a microchannel device according to any one of [1] to [7], wherein alignment is carried out between adjacent channel pattern layers by using a light-exposure apparatus with alignment mechanism in the step (ii-b) or the step (iii-b) or the step (n-b).

[9]
The method for producing a microchannel device according to [8], wherein the light-exposure apparatus with alignment mechanism is a direct imaging exposure equipment.

[10]
The method for producing a microchannel device according to any one of [1] to [9], further comprising a step of forming a lid member on a second or third or n-th channel pattern layer furthermost from the substrate by laminating as the lid member each resin layer of a laminate consisting of a support film and the resin layer so as to contact the second or the third or a (n−1)-th channel pattern layer.

[11]
The method for producing a microchannel device according to [10], further comprising a step of exposure to light following the step of forming the lid member.

[12]
The method for producing a microchannel device according to any one of [1] to [11], further comprising step (i-d), step (ii-d), step (iii-d) or step (n-d), of cleaning by acid or divalent ion-containing water, respectively following the step (i-c), the step (ii-c), the step (iii-c) or the step (n-c).

[13]

The method for producing a microchannel device according to any one of [1] to [12], further comprising step (i-e), step (ii-e), step (iii-e) or step (n-e), of exposure to light and/or heating, respectively following the step (i-d), the step (ii-d), the step (iii-d) or the step (n-d).

[14]

The method for producing a microchannel device according to any one of [1] to [13], wherein a transmission ratio at either or both of a wavelength of 515 nm and a wavelength of 600 nm is 80% or greater in the first channel pattern layer, the second channel pattern layer, the third channel pattern layer or the n-th channel pattern layer.

[15]

The method for producing a microchannel device according to any one of [1] to [14], wherein a minimum developing time is 15 seconds to 50 seconds in a 1% $Na_2CO_3$ aqueous solution at 30° C. per 25 μm thickness of the first photosensitive resin layer, the photosensitive layer of the second photosensitive resin laminate or the photosensitive layer of the third photosensitive resin laminate or the photosensitive layer of the n-th photosensitive resin laminate.

[16]

The method for producing a microchannel device according to any one of [1] to [15], wherein the first channel pattern layer, the second channel pattern layer, the third channel pattern layer or the n-th channel pattern layer has a layer thickness of 50 μm or greater and a pattern having an aspect ratio of 1.2 or greater.

[17]

A microchannel device comprising a plurality of channel patterns, wherein a first channel pattern and at least one channel pattern formed on the first channel pattern are different in terms of wettability.

[18]

The microchannel device according to [17], wherein the first channel pattern and at least one channel pattern formed on the first channel pattern are each formed of a cured resin having a mutually different composition.

Advantageous Effects of Invention

The method for producing a microchannel device of the present invention enables to produce with ease a multi-layered type microchannel device that is highly-defined and excellent in dimension accuracy and also enables channels thereof to be partially hydrophilized or hydrophobilized.

DESCRIPTION OF EMBODIMENTS

An embodiment for carrying out the invention (hereunder abbreviated to "the present embodiment") will now be explained in specific detail. Incidentally, it is to be understood, however, that the invention is not limited to the embodiments below and can be modified within the scope of the gist thereof.

Moreover, "to" means that numerals before and after "to" are included as upper limit values and lower limit values unless otherwise specified in the present description.

The method for producing a microchannel device of the present embodiment is characteristic in comprising:

(i) a step of sequentially carrying out step (i-a) of forming a first photosensitive resin layer on a substrate; step (i-b) of light-exposing the first photosensitive resin layer, and step (i-c) of developing the light-exposed photosensitive layer and forming a channel pattern layer, to form a first channel pattern layer; and (ii) a step of sequentially carrying out step (ii-a) of laminating a second photosensitive resin laminate on the first channel pattern layer formed in the step (i); step (ii-b) of light-exposing a photosensitive layer of the second photosensitive resin laminate; and step (ii-c) of developing the light-exposed photosensitive layer and forming a channel pattern layer, to form a second channel pattern layer. The method for producing a microchannel device of the present embodiment may also be further comprising:

(iii) a step of sequentially carrying out step (iii-a) of laminating a third photosensitive resin laminate on the second channel pattern layer formed in the step (ii); step (iii-b) of light-exposing a photosensitive layer of the third photosensitive resin laminate; and step (iii-c) of developing the light-exposed photosensitive layer and forming a channel pattern layer, to form a third channel pattern layer which is different from the second channel pattern layer in terms of wettability, and may be further comprising:

(n) repeated steps of sequentially carrying out step (n-a) of laminating a n-th photosensitive resin laminate on a (n−1)-th channel pattern layer wherein n is an integer of 4 or greater; step (n-b) of light-exposing a photosensitive layer of the n-th photosensitive resin laminate; and step (n-c) of developing the light-exposed photosensitive layer and forming a channel pattern layer, to form a n-th channel pattern layer.

The second channel pattern layer may be different from the first channel pattern layer in terms of wettability. Moreover, the third channel pattern layer may be different from the second channel pattern layer in terms of wettability, and further the n-th channel pattern layer may be different from the (n−1)-th channel pattern layer in terms of wettability.

[First Photosensitive Resin Layer]

The first photosensitive resin layer is formed on a substrate, and can be subsequently subjected to exposure to light, development, etc. Step (i-a) of forming the first photosensitive resin layer on the substrate can be carried out, for example, by laminating the first photosensitive resin laminate on a substrate; and applying the first photosensitive resin composition to the substrate such as coating, spraying, etc. The coating can be carried out by, for example, spin coating, spray coating, bar coating, printing method, etc., among which spin coating is preferable. The first photosensitive resin composition may be in the form of, for example, liquid, solid, or gel, etc., and among these, a liquid resist is preferred from the viewpoint of steps (i-b) and (i-c). The liquid resist can be produced by a method similar to that of the compounding liquid of the photosensitive resin composition described below. The first photosensitive resin composition may be dried after being applied to the base material, if desired.

[Photosensitive Resin Laminate]

The first to third photosensitive resin laminates each comprise at least a support film and a photosensitive resin composition layer (photosensitive layer) laminated on the support film, and may further comprise a protective film laminated on the photosensitive resin composition layer, if desired. A photosensitive film called a dry film resist or dry film photoresist is also included in the photosensitive resin laminate. The first to third photosensitive resin laminates or the n-th photosensitive resin laminate wherein n is an integer of 4 or greater, each can be used for forming microchannels by photolithography, and for example, can be used as a partition member of microchannels, a lid member of microchannels, etc.

The first to third or n-th photosensitive resin laminates can be designed such that the wettability (of liquid flowing in a channel) such as a contact angle and an interface energy for each of the first to third or n-th channel patterns which are formed by using these laminates, is mutually different.

Incidentally, the photosensitive resin laminates forming each channel pattern layer may be the same or different provided that these have mutually different wettability (of liquid that flows in a channel) such as a contact angle and an interface energy with respect to the channel pattern to be formed. In the case of, for example, forming multi-layered partitions by using the identical photosensitive resin laminates, the flow behavior of the fluid in each microchannel can be controlled by the surface shape of the portion in contact with the fluid. Namely, each channel can be designed to have mutually different wettability by patterning the partition and/or the bottom surface constituting each channel so as to have concave-convex shapes, and by varying the shape or number thereof.

The Wenzel model and Cassie-Baxter model have been known as models that express the relationship between a surface shape and wettability. In a solid surface having a concave-convex shape, the Wenzel model refers to a state in which fluid enters a concave portion and the entire solid surface is wet. In the case of the Wenzel model, the wettability of a solid is emphasized by increasing a surface area of contact of the solid and fluid, and a hydrophobic solid becomes more hydrophobic and a hydrophilic solid becomes more hydrophilic. On the other hand, the Cassie-Baxter model refers to a state in which fluid cannot reach the bottom of the groove on the concave-convex surface and an air layer is formed in the concave portion. In the Cassie-Baxter model, the solid surface is more hydrophobic because the fluid also contacts hydrophobic air.

Furthermore, when multi-layered partitions are formed by using different photosensitive resin laminates, the flow behavior of the fluid in a microchannel can be controlled by adjusting the composition of the photosensitive resin composition constituting the photosensitive resin laminate (i.e., the type and/or amount of the components).

An I/O value refers to an index of hydrophilicity and hydrophobicity or wettability in a composition of the photosensitive resin laminate.

The I/O value is a ratio (I/O) of an inorganic value (I) and an organic value (O), and is a value of polarity of a member material or compound that is dealt from an aspect of organic concept. Moreover, it is a kind of functional group contribution method that sets a parameter to each functional group.

The ratio (I/O) is explained in detail in the literatures such as *Organic Conceptual Diagram* (translated from Japanese) (Yoshio Koda, Sankyo Publishing (1984)); KUMAMOTO PHARMACEUTICAL BULLETIN, 1, pp 1-16 (1954); Field of Chemistry (translated from Japanese), 11, 10, pp 719-725 (1957), etc. The ratio (I/O) is roughly classified into an organic group exhibiting a covalent bond property and an inorganic group exhibiting an ionic bond property of a structural member or a compound, which are each positioned on orthogonal coordinates referred to as an organic axis and an inorganic axis.

The inorganic value (I) is a numerical value based on a hydroxyl group, which indicates a magnitude of an influence of each of various substituents or bonds, etc., of an organic compound on a boiling point. Specifically, if the distance between the boiling point curve of linear alcohol and the boiling point curve of linear paraffin is taken in the vicinity of 5 carbon atoms, the boiling point will be about 100° C., and therefore, the influence of one hydroxyl group is set to 100 numerically. The numerical value of an influence of each of various substituents or various bonds, etc., on a boiling point based on this numerical value is inorganic value (I) of a substituent that the organic compound has. For example, the —COOH group has an inorganic value (I) of 150 and the double bond has an inorganic value (I) of 2. Therefore, the inorganic value (I) of a certain kind of organic compound refers to the sum of the inorganic values (I) of various substituents or bonds, etc., that the compound has.

An organic value (O) is defined based on an influence of a carbon atom represented by a methylene group in a molecule, which is taken as a unit, on a boiling point. Namely, an average value of an increase in a boiling point due to addition of one carbon in the vicinity of 5 to 10 carbon atoms of a linear saturated hydrocarbon compound is 20° C., and therefore an organic value of one carbon atom is set to 20 based thereon. The organic value (O) on the basis thereof is a numerical value of an influence of each of various substituents or bonds, etc., on a boiling point. For example, the organic value (O) of a nitro group (—$NO_2$) is 70.

Generally, the closer the ratio (I/O) comes to 0, the more nonpolar (more hydrophobic and organic) an organic substance goes, while the larger the value is, the more polar (more hydrophilic and inorganic) an organic substance is.

Constituents of the first to n-th photosensitive resin compositions or photosensitive resin laminates will be described below.

<Photosensitive Resin Composition>

The photosensitive resin composition may compromise arbitrary polymers and/or monomers provided that these can impart photosensitivity to the photosensitive resin laminate, and further compromise a photopolymerization initiator, other additives, etc., if desired.

The photosensitive resin composition preferably comprises an alkali soluble polymer containing a carboxyl group (a), addition-polymerizable monomer (b), and photopolymerization initiator (c) from the viewpoint of forming of a microchannel device by photolithography and lamination of a photosensitive resin laminate and a base material, etc. Moreover, the photosensitive resin composition may comprise epoxy resins such as an EPON (registered trademark) SU-8 type resin, a bisphenol A novolac epoxy resin, etc., provided that the photosensitive resin composition layer can be formed into a film by using the photosensitive resin composition.

(a) Carboxyl Group-Containing Alkali Soluble Polymer

The carboxyl group-containing alkali soluble polymer (a) has an α, β-unsaturated carboxyl group-containing monomer as a polymerization component, and the alkali soluble polymer preferably has an acid equivalent of 100 to 600 and a weight-average molecular weight of 5,000 to 500,000. It is necessary for a carboxyl group in the carboxyl group-containing alkali soluble polymer to enable the photosensitive resin composition to have developability or stripping property with respect to a developing solution or stripping solution consisting of an alkali aqueous solution. The acid equivalent refers to a weight of the alkali soluble polymer having 1 equivalent of a carboxyl group therein. The lower limit of the acid equivalent is more preferably 250, and the upper limit thereof is more preferably 450. The acid equivalent of the carboxyl group-containing alkali soluble polymer (a) is preferably 100 or greater from the standpoint of improving a development resistance, resolution and adhesiveness and further from the viewpoint of ensuring compatibility with a solvent or other components in the photosensitive resin composition, particularly the addition-polymerizable monomer (b) described below, and the acid equivalent is preferably 600 or less from the viewpoint of improving developability and stripping property. The acid equivalent is measured by a potentiometric titration method using a Hiranuma automatic titrator (COM-555) manufactured by Hiranuma Sangyo Co., Ltd. and 0.1 mol/L sodium hydroxide.

The weight-average molecular weight of the carboxyl group-containing alkali soluble polymer (a) is preferably 5,000 to 500,000. The weight-average molecular weight is preferably 5,000 or greater from the viewpoint of improving the fluid resistance of the photosensitive resin laminate, from the viewpoint of inhibiting air from being mixed into the microchannel upon lamination, and from the standpoint of making a thickness of the photosensitive resin laminate uniform to produce a tolerance to a developer. Moreover, it is preferably 500,000 or less from the standpoint of maintaining developability. In order to achieve both the fluid resistance and developability, the lower limit of the weight-average molecular weight of the carboxyl group-containing alkali soluble polymer (a) is more preferably 20,000 or greater or 40,000 or greater, and the upper limit thereof is more preferably 250,000 or less, 200,000 or less, 150,000 or less, or 100,000 or less.

In the present description, the weight-average molecular weight refers to a weight-average molecular weight measured by gel permeation chromatography (GPC) using a calibration curve of polystyrene (Shodex STANDARD SM-105 manufactured by Showa Denko K. K). The weight-average molecular weight of the carboxyl group-containing alkali soluble polymer (a) can be measured by using gel permeation chromatography manufactured by JASCO Corporation under the following conditions:

Differential Refractometer: RI-1530
Pump: PU-1580
Degasser: DG-980-50
Column oven: CO-1560
Column: KF-8025, KF-806Mx2, KF-807 in order
Eluent: THF.

The carboxyl group-containing alkali soluble polymer (a) is preferably a (co)polymer containing at least one monomer selected from the first or second monomer described below as a component.

The first monomer is carboxylic acid or acid anhydride having one polymerizable unsaturated group in the molecule. The first monomer includes, for example, (meth)acrylic acid, fumaric acid, cinnamic acid, crotonic acid, itaconic acid, maleic anhydride, and maleic acid half ester. Among these, (meth)acrylic acid is preferable from the viewpoint of alkali developability.

The second monomer is a non-acidic monomer having at least one polymerizable unsaturated group in the molecule. The second monomer includes, for example, methyl (meth)acrylate, ethyl (meth)acrylate, n-propyl (meth)acrylate, isopropyl (meth)acrylate, n-butyl (meth)acrylate, isobutyl (meth)acrylate, tert-butyl (meth)acrylate, 2-hydroxyethyl (meth)acrylate, 2-hydroxypropyl (meth)acrylate, cyclohexyl (meth)acrylate, 2-ethylhexyl (meth)acrylate, benzyl (meth)acrylate, vinyl alcohol esters such as vinyl acetate, etc., (meth)acrylonitrile, styrene, and polymerizable styrene derivatives. Among these, at least one selected from the group consisting of methyl (meth)acrylate, n-butyl (meth)acrylate, styrene, 2-ethylhexyl (meth)acrylate, 2-hydroxyethyl (meth)acrylate and benzyl (meth)acrylate is preferable with styrene being more preferable, from the viewpoint of the resolution of the microchannel pattern.

Throughout the present description, "(meth)acrylic" refers to "acrylic" and the corresponding "methacrylic", and "(meth)acrylate" refers to "acrylate" and the corresponding "methacrylate". Moreover, "(meth)acryloyl" refers to "acryloyl" and the corresponding "methacryloyl".

The carboxyl group-containing alkali soluble polymer (a) can be synthesized by mixing the aforementioned monomers and adding an appropriate amount of a radical polymerization initiator such as benzoyl peroxide or azoisobutyronitrile to a solution diluted with a solvent such as acetone, methyl ethyl ketone or isopropanol, and stirring with heating. In some cases, a portion of the mixture is added dropwise to the reaction solution to carry out synthesis. After completion of the reaction, a solvent may be further added to the reaction product to adjust the concentration to a desired concentration. In addition to the solution polymerization, bulk polymerization, suspension polymerization, or emulsion polymerization may be employed as synthesis means.

With respect to a copolymerization proportion of the first monomer and the second monomer in the carboxyl group-containing alkali soluble polymer (a), the proportion is preferably 10 to 60% by weight of the first monomer and 40 to 90% by weight of the second monomer and more preferably 15 to 35% by weight of the first monomer and 65 to 85% by weight of the second monomer.

More specifically, the carboxyl group-containing alkali soluble polymer (a), for example, include a polymer containing methyl methacrylate, methacrylic acid and styrene as copolymerization components, a polymer containing methyl methacrylate, methacrylic acid and n-butyl methacrylate as copolymerization components, a polymer containing methacrylic acid, benzyl methacrylate and styrene as copolymerization components, a polymer containing methacrylic acid and benzyl methacrylate as copolymerization components, a polymer containing methacrylic acid, 2-ethylhexyl acrylate, 2-hydroxyethyl methacrylate and styrene as copolymerization components, etc.

The content of the carboxyl group-containing alkali soluble polymer (a) in the photosensitive resin composition is preferably within the range of 20 to 90% by weight and more preferably 40 to 60% by weight, based on the total solid content of the photosensitive resin composition. The content of the carboxyl group-containing alkali soluble polymer (a) is preferably 20% by weight or more from the viewpoint of maintaining the resistance of the photosensitive resin composition upon photolithography, and is preferably 90% by weight or less from the viewpoint that the photosensitive resin composition before curing and the resist pattern after curing produce flexibility.

(b) Addition-Polymerizable Monomer

The addition-polymerizable monomer (b) is a compound having at least one polymerizable ethylenically unsaturated bond in the molecule. The ethylenically unsaturated bond is preferably a terminally ethylenically unsaturated group. Moreover, from the viewpoint of high resolution of the microchannel pattern and a shape of the partition, at least one selected from the group consisting of a bisphenol A-based (meth)acrylate compound, a polyfunctional monomer, a monomer having repeated units of alkylene oxide, cyclic monomers and aromatic monomers, is preferably used as the addition-polymerizable monomer (b).

In the present description, a bisphenol A-based (meth) acrylate compound refers to a compound having a carbon-carbon unsaturated double bond derived from an acryloyl group or a methacryloyl group and a —$C_6H_4$—$C(CH_3)_2$—$C_6H_4$— group derived from bisphenol A.

Specifically, the bisphenol A-based (meth)acrylate compound includes, for example, dimethacrylate of polyethylene glycol having an average of 2 mol units of ethylene oxide each added to both ends of bisphenol A (NK Ester BPE-200 manufactured by Shin-Nakamura Chemical Co., Ltd.), dimethacrylate of polyethylene glycol having an average of 5 mol units of ethylene oxide each added to both ends of bisphenol A (NK Ester BPE-500 manufactured by Shin-Nakamura Chemical Co., Ltd.), dimethacrylate of polyalkylene glycol having an average of 6 mol units of ethylene oxide and an average of 2 mol units of propylene oxide each added to both ends of bisphenol A, or dimethacrylate of polyalkylene glycol having an average of 15 mol units of ethylene oxide and an average of 2 mol units of propylene oxide each added to both ends of bisphenol A.

The addition-polymerizable monomer (b) other than the bisphenol A-based (meth)acrylate compound includes, for example, 4-nonylphenylheptaethylene glycol dipropylene glycol acrylate, 2-hydroxy-3-phenoxypropyl acrylate, phenoxyhexaethylene glycol acrylate, a reaction product of a half-ester compound of phthalic anhydride and 2-hydroxypropyl acrylate, and propylene oxide (product name OE-A200, manufactured by Nippon Shokubai Kagaku Kogyo Co., Ltd.), dimethacrylate of glycol obtained by further adding an average of 3 mol of ethylene oxide each to both ends of polypropylene glycol having an average of 12 mol of added propylene oxide, dimethacrylate of polybutylene glycol having an average of 28 mol of added butylene oxide; polyoxyalkylene glycol di(meth)acrylates such as 4-n-octylphenoxypentapropylene glycol acrylate, 1,6-hexanediol (meth)acrylate, 1,4-cyclohexanediol di(meth)acrylate, polypropylene glycol di(meth)acrylate, polyethylene glycol di(meth)acrylate, etc., 2-di(p-hydroxyphenyl) propane di(meth)acrylate, glycerol tri(meth)acrylate, pentaerythritol tri-, tetra- or penta(meth)acrylate, trimethylolpropane triglycidyl ether tri(meth)acrylate; 2,2-bis(4-(meth)acryloxypentaethoxyphenyl) propane; 2,2-bis(4-((meth)acryloxypentaethoxy)cyclohexyl) propane; polyfunctional (meth)acrylate containing polyurethane groups such as a urethane compound of hexamethylene diisocyanate and nonapropylene glycol monomethacrylate, etc., dimethacrylate of polyurethane diol synthesized from polybutylene glycol having an average of 28 mol of added butylene oxide and hexamethylenediamine, polyfunctional (meth)acrylate of an isocyanuric acid ester compound, etc. These may be used alone or in combination of two or more, and may be combined in use with a bisphenol A-based (meth)acrylate compound.

The content of the addition-polymerizable monomer (b) in the photosensitive resin composition is preferably in the range of 5 to 75% by weight, more preferably 15 to 70% by weight, and furthermore preferably 20 to 55% by weight, based on the total solid content of the photosensitive resin composition. The content of the addition-polymerizable monomer (b) is preferably 5% by weight or more from the viewpoint of the resolution of the microchannel pattern or the adhesiveness of the sealing material, and is preferably 75% by weight or less from the standpoint of the flexibility of the cured product of the photosensitive resin laminate.

(c) Photopolymerization Initiator

The photopolymerization initiators (c) is an initiator usually used as a photopolymerization initiator for a photosensitive resin and can be used as appropriate. For example, hexaarylbisimidazole (hereinafter, also referred to as triarylimidazolyl dimer) can be used.

The triarylimidazolyl dimer includes, for example, 2-(o-chlorophenyl)-4,5-diphenylimidazolyl dimer (hereinafter, also referred to as "2,2'-bis-(2-chlorophenyl)-4,4',5,5'-tetraphenyl-1,1'-bisimidazole"), 2,2',5-tris-(o-chlorophenyl)-4-(3,4-dimethoxyphenyl)-4',5'-diphenylimidazolyl dimer, 2,4-bis-(o-chlorophenyl)-5-(3,4-dimethoxyphenyl)-diphenylimidazolyl dimer;

2,4,5-tris-(o-chlorophenyl)-diphenylimidazolyl dimer, 2-(o-chlorophenyl)-bis-4,5-(3,4-dimethoxyphenyl)-imidazolyl dimer, 2,2'-bis-(2-fluorophenyl)-4,4',5,5'-tetrakis-(3-methoxyphenyl)-imidazolyl dimer, 2,2'-bis-(2,3-difluoromethylphenyl)-4,4',5,5'-tetrakis-(3-methoxyphenyl)-imidazolyl dimer, 2,2'-bis-(2,4-difluorophenyl)-4,4',5,5'-tetrakis-(3-methoxyphenyl)-imidazolyl dimer;

2,2'-bis-(2,5-difluorophenyl)-4,4',5,5'-tetrakis-(3-methoxyphenyl)-imidazolyl dimer, 2,2'-bis-(2,6-difluorophenyl)-4,4',5,5'-tetrakis-(3-methoxyphenyl)-imidazolyl dimer, 2,2'-bis-(2,3,4-trifluorophenyl)-4,4',5,5'-tetrakis-(3-methoxyphenyl)-imidazolyl dimer, 2,2'-bis-(2,3,5-trifluorophenyl)-4,4',5,5'-tetrakis-(3-methoxyphenyl)-imidazolyl dimer;

2,2'-bis-(2,3,6-trifluorophenyl)-4,4',5,5'-tetrakis-(3-methoxyphenyl)-imidazolyl dimer, 2,2'-bis-(2,4,5-trifluorophenyl)-4,4',5,5'-tetrakis-(3-methoxyphenyl)-imidazolyl dimer, 2,2'-bis-(2,4,6-trifluorophenyl)-4,4',5,5'-tetrakis-(3-methoxyphenyl)-imidazolyl dimer;

2,2'-bis-(2,3,4,5-tetrafluorophenyl)-4,4',5,5'-tetrakis-(3-methoxyphenyl)-imidazolyl dimer, 2,2'-bis-(2,3,4,6-tetrafluorophenyl)-4,4',5,5'-tetrakis-(3-methoxyphenyl)-imidazolyl dimer, and 2,2'-bis-(2,3,4,5,6-pentafluorophenyl)-4,4',5,5'-tetrakis-(3-methoxyphenyl)-imidazolyl dimer.

Among these, 2-(o-chlorophenyl)-4,5-diphenylimidazolyl dimer is preferable because it has a high effect on the resolution of the microchannel pattern or the strength of the cured resist film. These may be used alone or in combination of two or more and may be combined for use with an acridine compound, pyrazoline compound, etc., to be explained below.

An acridine compound or a pyrazoline compound can also be used as the photopolymerization initiator (c). The acridine compound includes acridine, 9-phenylacridine, 9-(4-tolyl)acridine, 9-(4-methoxyphenyl)acridine, 9-(4-hydroxyphenyl)acridine, 9-ethylacridine, 9-chloroethylacridine, 9-methoxyacridine, 9-ethoxyacridine;

9-(4-methylphenyl)acridine, 9-(4-ethylphenyl)acridine, 9-(4-n-propylphenyl)acridine, 9-(4-n-butylphenyl)acridine, 9-(4-tert-butylphenyl)acridine, 9-(4-ethoxyphenyl)acridine, 9-(4-acetylphenyl)acridine, 9-(4-dimethylaminophenyl) acridine, 9-(4-chlorophenyl)acridine;

9-(4-bromophenyl)acridine, 9-(3-methylphenyl)acridine, 9-(3-tert-butylphenyl)acridine, 9-(3-acetylphenyl)acridine, 9-(3-dimethylaminophenyl)acridine, 9-(3-diethylaminophenyl)acridine, 9-(3-chlorophenyl)acridine, 9-(3-bromophenyl)acridine, 9-(2-pyridyl)acridine, 9-(3-pyridyl)acridine, and 9-(4-pyridyl)acridine. Among these, 9-phenylacridine is desirable.

The acridine compound is preferably combined for use with a halogen compound from the viewpoint of the curability of the photosensitive resin layer after exposure to light. The halogen compound includes, for example, amyl bromide, isoamyl bromide, isobutylene bromide, ethylene bromide, diphenylmethyl bromide, benzal bromide, methylene bromide, tribromomethylphenyl sulfone, carbon tetrabromide, tris(2, 3-dibromopropyl)phosphate, trichloroacetamide, amyl iodide, isobutyl iodide, 1,1,1-trichloro-2,2-bis(p-chlorophenyl)ethane, hexachloroethane, chlorinated triazine compounds, etc. Among these, tribromomethylphenyl sulfone is preferable from the viewpoint of curability.

The pyrazoline compound is preferably 1-phenyl-3-(4-tert-butyl-styryl)-5-(4-tert-butyl-phenyl)-pyrazoline, 1-(4-(benzoxazol-2-yl)phenyl)-3-(4-tert-butyl-styryl)-5-(4-tert-butyl-phenyl)-pyrazoline, 1-phenyl-3-(4-biphenyl)-5-(4-tert-butyl-phenyl)-pyrazoline, or 1-phenyl-3-(4-biphenyl)-5-(4-tert-octyl-phenyl)-pyrazoline.

Other photopolymerization initiators include quinones such as 2-ethylanthraquinone, octaethylanthraquinone, 1,2-benzanthraquinone, 2,3-benzanthraquinone, 2-phenylanthraquinone, 2,3-diphenylanthraquinone, 1-chloroanthraquinone, 1,4-naphthoquinone, 9,10-phenanthraquinone, 2-methyl-1,4-naphthoquinone, 2,3-dimethylanthraquinone, 3-chloro-2-methylanthraquinone, etc.;

aromatic ketones such as benzophenone, Michler's ketone [4,4'-bis(dimethylamino)benzophenone], 4,4'-bis(diethylamino)benzophenone, etc., benzoin ethers such as benzoin, benzoin ethyl ether, benzoin phenyl ether, methylbenzoin, ethylbenzoin, etc.;

a combination of benzyl dimethyl ketal, benzyl diethyl ketal and thioxanthones, and alkylaminobenzoic acid, and oxime esters such as 1-phenyl-1,2-propanedione-2-O-benzoin oxime, 1-phenyl-1,2-propanedione-2-(O-ethoxycarbonyeoxime, etc.

The oxime compound is preferable in the case of requiring colorless transparency of the microchannel or from the viewpoint of inhibiting fluorescence emission to facilitate detection of a luminescence signal of the microchannel device. The oxime compound includes, for example, Irgacure OXE01 and Irgacure OXE02 manufactured by BASF Japan Ltd., ADEKA ARKLS NCI-831 manufactured by ADEKA Corporation, etc.

Incidentally, combinations of the aforementioned thioxanthones and alkylaminobenzoic acid include, for example, a combination of ethyl thioxanthone and ethyl dimethylaminobenzoate, combination of 2-chlorothioxanthone and ethyl dimethylaminobenzoate, and combination of isopropylthioxanthone and ethyl dimethylaminobenzoate. Moreover, N-aryl amino acid may be used. The N-aryl amino acid includes N-phenylglycine, N-methyl-N-phenylglycine, N-ethyl-N-phenylglycine, etc., with N-phenylglycine being particularly preferable among these.

The content of the photopolymerization initiator (c) in the photosensitive resin composition is preferably in the range of 0.01 to 30% by weight based on the total solid content of the photosensitive resin composition. The lower limit thereof is more preferably 0.05% by weight or more and furthermore preferably 0.1% by weight or more. The upper limit is more preferably 15% by weight or less and still more preferably 10% by weight or less. The content of the photopolymerization initiator (c) is preferably 0.01% by weight or more in order to obtain sufficient sensitivity upon photopolymerization by exposure to light, and is preferably 30% by weight or less from the viewpoint of sufficiently transmitting light to the bottom surface (i.e., a portion farther from a light source) of the photosensitive resin composition upon photopolymerization, to obtain favorable resolution and adhesiveness.

(d) Other Additives

The photosensitive resin composition may contain various additives in addition to the aforementioned components (a) to (c).

In order to improve the thermal stability and storage stability of the photosensitive resin composition, for example, at least one compound selected from the group consisting of radical polymerization inhibitors, benzotriazoles, carboxybenzotriazoles and hindered phenol-based antioxidants is preferably contained in the photosensitive resin composition.

The radical polymerization inhibitor includes, for example, p-methoxyphenol, hydroquinone, pyrogallol, naphthylamine, tert-butyl catechol, cuprous chloride, 2,6-di-tert-butyl-p-cresol, 2,2'-methylenebis(4-methyl-6-tert-butylphenol), 2,2'-methylenebis(4-ethyl-6-tert-butylphenol), nitrosophenylhydroxyamine aluminum salt, and diphenyl nitrosamine.

The benzotriazoles include, for example, 1,2,3-benzotriazole, 1-chloro-1,2,3-benzotriazole, bis(N-2-ethylhexyl) aminomethylene-1,2,3-benzotriazole, bis(N-2-ethylhexyl) aminomethylene-1,2,3-tolyltriazole, and bis(N-2-hydroxyethyl)aminomethylene-1,2,3-benzotriazole.

The carboxybenzotriazoles include, for example, 4-carboxy-1,2,3-benzotriazole, 5-carboxy-1,2,3-benzotriazole, (N, N-dibutylamino)carboxybenzotriazole, N—(N, N-di-2-ethylhexyl) aminomethylenecarboxybenzotriazole, N—(N, N-di-2-hydroxyethyl) aminomethylenecarboxybenzotriazole, and N—(N, N-di-2-ethylhexyl) aminoethylenecarboxybenzotriazole.

The hindered phenol-based antioxidants include, for example, IRGANOX series manufactured by BASF Japan Ltd., ADEKA STAB (AO) series manufactured by ADEKA Corporation, etc.

The total addition amount of radical polymerization inhibitors, benzotriazoles, carboxybenzotriazoles and/or hindered phenol-based antioxidants is preferably 0.001 to 3% by weight based on the total solid content of the photosensitive resin composition. The lower limit thereof is more preferably 0.05% by weight or more, and the upper limit thereof is more preferably 1% by weight or less. The total addition amount is preferably 0.001% by weight or more from the viewpoint of imparting storage stability to the photosensitive resin composition, and is preferably 3% by weight or less from the viewpoint of maintaining sensitivity.

Other coloring agents may be contained in the photosensitive resin composition, as necessary. Such coloring agents include, for example, phthalocyanine green, crystal violet, methyl orange, Nile blue 2B, Victoria blue, malachite green, Basic Blue 20, diamond green, etc., or a color-dye such as a combination of a leuco dye or a fluoran dye, and a halogen compound, etc.

The leuco dye includes, for example, tris(4-dimethylamino-2-methylphenyl)methane [Leuco Crystal Violet], tris (4-dimethylamino-2-methylphenyl)methane [Leuco Malachite Green], and a fluoran dye.

The halogen compound includes amyl bromide, isoamyl bromide, isobutylene bromide, ethylene bromide, diphenylmethyl bromide, benzal bromide, methylene bromide, tribromomethylphenyl sulfone, carbon tetrabromide, tris(2,3-dibromopropyl)phosphate, trichloroacetamide, amyl iodide, isobutyl iodide, 1,1,1-trichloro-2,2-bis(p-chlorophenyl)ethane, hexachloroethane, chlorinated triazine compounds, etc.

The content of the coloring agent in the photosensitive resin composition is preferably 0.01 to 10% by weight, more preferably 0.1 to 5% by weight, furthermore preferably 0.5 to 2% by weight, and particularly preferably 0.5 to 1% by weight, based on the total solid content of the photosensitive resin composition.

The photosensitive resin composition may contain other plasticizers, as necessary. Such plasticizers include, for example, a compound such as polyalkylene oxide-modified bisphenol A.

In addition to the aforementioned compounds, for example, sorbitan derivatives such as polyoxyethylene sorbitan laurate, polyoxyethylene sorbitan oleate, etc., polyalkylene glycols such as polyethylene glycol, polypropylene glycol, etc., phthalic acid esters such as diethyl phthalate, etc., plasticizers such as o-toluene sulfonic acid amide, p-toluenesulfonic acid amide, tributyl citrate, triethyl citrate, triethyl acetyl citrate, tri-n-propyl acetyl citrate, tri-n-butyl acetyl citrate, etc., can be used. The sorbitan derivatives and polyalkylene glycols are particularly preferably used.

The content of the plasticizer in the photosensitive resin composition is preferably 1 to 50% by weight based on the total solid content of the photosensitive resin composition. The lower limit of the plasticizer is more preferably 3% by weight and the upper limit thereof is more preferably 30% by weight. The content is preferably 1% by weight or more from the viewpoint of inhibiting developing delay and imparting flexibility to a cured film and is preferably 50% by weight or less from the viewpoint of inhibiting insufficient curing.

<Support Film>

The support film may be any film provided that it supports the photosensitive resin composition layer in the form of a film. The support film used is preferably a transparent film that transmits a light emitted from an exposure light source. Such a support film includes a polyethylene terephthalate film, polyvinyl alcohol film, polyvinyl chloride film, vinyl chloride copolymer film, polyvinylidene chloride film, vinylidene chloride copolymer film, polymethyl methacrylate copolymer film, polystyrene film, polyacrylonitrile film, styrene copolymer film, polyamide film, cellulose derivative film, etc. The films stretched taut may be used, as necessary. From the viewpoint of resolution, the film preferably has a haze value of 5 or less, more preferably a haze value of 3 or less, still more preferably a haze value of 2.5 or less, and even still more preferably a haze value of 1 or less. The thinner a thickness of the support film is, more advantageous it becomes in terms of image forming property and economy, however, support films having a thickness of 10 to 30 μm are preferably used from the viewpoint of the film thickness of the photosensitive resin laminate or maintaining the thermal shrinkage upon coating of the photosensitive resin composition layer. For example, GR-19 and GR-16 manufactured by Teijin Films Ltd., R310-16 and R340G16 manufactured by Mitsubishi Plastics Inc., FB40 (16 μm film thickness) and FB60 (16 μm film thickness) manufactured by Toray Polyester Film Co., Ltd., etc., are included.

<Protective Film>

The protective film may be any film provided that it has less adhesion for the photosensitive resin composition layer than the support film and can be stripped off. For example, a polyethylene film, polypropylene film, stretched polypropylene film, etc., can be used as the protective film. Moreover, a film having excellent a stripping property disclosed in Japanese Unexamined Patent Application Publication No. 1984(S59)-202457 can be used. The protective film is preferably a propylene film or a plastic film that was subjected to releasing treatment from the viewpoint of being stripped off from the photosensitive resin laminate when the microchannel device is formed. From the same viewpoint, the protective film is preferably disposed on the surface of the photosensitive resin composition layer opposite the surface on which the support film is formed.

The thickness of the protective film is preferably 10 to 100 μm and more preferably 10 to 50 μm from the viewpoint of film thickness and dimensional stability of the photosensitive resin laminate. Specific examples of the protective film include a release-treated PET film 25X (film thickness of 25 μm) manufactured by Lintec Co., Ltd., GF-18, GF-818, and GF-858 manufactured by Tamapoly Co., Ltd., etc.

<Production Method of Photosensitive Resin Laminate>

Known methods can be employed as a method for producing the photosensitive resin laminate. The photosensitive resin laminate can be obtained, for example, by mixing a photosensitive resin composition constituting a photosensitive resin composition layer with a solvent to prepare a compounding solution of the photosensitive resin composition, coating a support film with it and drying by using a bar coater or a roll coater, and laminating the photosensitive resin composition layer consisting of the photosensitive resin composition on the support film. A protective film may be further laminated on the photosensitive resin composition layer if desired.

The compounding solution of the photosensitive resin composition is preferably prepared by adding a solvent so that the viscosity at 25° C. is 500 to 4000 mPa·second. Solvents including methyl ethyl ketone, acetone, ethanol, methanol, propanol, propylene glycol monomethyl ether, propylene glycol monomethyl ether acetate, toluene, etc., can be appropriately selected for use from the viewpoint of the viscosity, dryability, residual solvent content, coatability or foamability of the compounding solution of the photosensitive resin composition.

The photosensitive resin laminate is wound around a winding core in a state of being optionally laminated with a protective film and can be used in the form of a roll. Moreover, the photosensitive resin laminate may be covered with a light-shielding sheet such as a polyethylene film, etc., from the viewpoint of inhibiting adhesion of foreign substances and exposure to light during storage or transportation.

[Multi-Layered Type Microchannel Device Using Photosensitive Resin Laminate and Production Method Thereof]

The multi-layered type microchannel device by using the photosensitive resin laminate of the present embodiment is a device provided with a layered structure and micro-order size channels, and can be used as various microchannel devices such as a POCT (Point of Care Testing) kit, ELISA (Enzyme-Linked ImmunoSorbent Assay) device, microreactor, etc. The microchannel device of the present embodiment is provided with a base material, a microchannel consisting of a partition member formed photolithographically by using the photosensitive resin laminate, and a lid member that is disposed so as to cover the microchannel. In one aspect, the microchannel device may be provided with an introduction unit that introduces fluid to a microchannel and a discharge unit that discharges the fluid from the microchannel, and the fluid may be delivered to a desired position of the device by a pump, a centrifugal force, etc.

The base material may be composed of either a translucent material or a non-translucent material. In the case of detecting a state of fluid in a channel by light, a material having excellent transparency to the light is used. The transparent material is formed of a resin, glass, etc., and is more preferably formed of a resin. The resin constituting the base material includes, from the viewpoint of being suitable for forming a microchannel, an acrylic resin, polypropylene, polycarbonate resin, cycloolefin resin, polystyrene resin, polyester resin, urethane resin, vinyl chloride resin, silicone resin, fluororesin, etc. The non-transparent material includes a silicon wafer, copper-clad laminate, etc. When a state of fluid in a channel is detected by electrical conductivity, etc., an electric circuit board having metal wirings formed thereon, etc., are used. The base material may be smooth or have a concave-convex shape. The concave-convex shape can be applied to, for example, a case where a microchannel through which fluid (liquid or gas) passes is formed on surface, and a case where an electric circuit by metal wiring is formed on surface. The thickness of the base material is not particularly limited, however is preferably 10 µm to 10 mm.

The partition member is formed of the aforementioned photosensitive resin laminate. The channel size is selected according to purposes, however, may be, for example, a width of 1 to 1000 µm, or 10 to 70 µm, a depth of 1 to 50 µm, or 5 to 30 µm. In one aspect, both the bottom surface and the side surface of the microchannel may be flat or a concave-convex shape, and the angle formed by these may be an approximately right angle, however the microchannel shape is not restricted thereto, and may be designed accordingly.

The first channel pattern layer, second channel pattern layer, third channel pattern layer, or the n-th channel pattern layer may have a layer thickness of 50 µm or more, and a pattern aspect ratio of 1.2 or more.

Moreover, in the first channel pattern layer, second channel pattern layer, third channel pattern layer or n-th channel pattern layer, the transmittance at either or both of the wavelengths of 515 nm and 600 nm can be 80% or more.

The lid member is preferably a fluid-resistant material, and when detecting a state of fluid in a channel with light, a lid member having high transparency to light including for example, the aforementioned photosensitive resin laminate, is used. The thickness of the lid member is selected depending on purposes, and is, for example, 10 µm to 10 mm.

A method for producing the multi-layered type microchannel device by using the photosensitive resin laminate will be described below, and thereby it is possible to form a channel having a complicated shape with excellent dimensional accuracy and favorable fluid resistance.

The method for producing the microchannel device of the present embodiment is as described above.

Moreover, the method may further include a step of forming a lid member by laminating as the lid member a resin layer of a laminate composed of a support film and the resin layer on the second, or third or n-th channel pattern layer furthermost from the aforementioned substrate, so that the resin layer is in contact therewith.

<Step (i-a) of Laminating First Photosensitive Resin Laminate on Substrate, Step (ii-a) of Laminating Second Photosensitive Resin Laminate on First Channel Pattern Layer, Step (iii-a) of Laminating Third Photosensitive Resin Laminate on Second Channel Pattern Layer, and Step (n-a) of Laminating N-th Photosensitive Resin Laminate on (N−1)-th Channel Pattern Layer>

A protective film (if present) is stripped off from the first photosensitive resin laminate, and the first photosensitive resin laminate is brought into close contact on a base material by using a hot laminator, etc., so that the side of the first photosensitive resin composition layer is opposite to the base material while the support film is maintained, to form a photosensitive layer of the first photosensitive laminate.

Moreover, a protective film (if present) is stripped off from the second photosensitive resin laminate, and the second photosensitive resin laminate is brought into close contact on the first pattern layer instead of the base material by using a hot laminator, etc., so that the side of the second photosensitive resin composition layer is opposite to the first pattern layer while the support film is maintained, to form a photosensitive layer of the second photosensitive laminate.

Furthermore, in some case, a protective film (if present) is stripped off from the third photosensitive resin laminate, and the third photosensitive resin laminate is brought into close contact on the second pattern layer by using a hot laminator, etc., so that the side of the third photosensitive resin composition layer is opposite to the second pattern layer while the support film is maintained, to form a photosensitive layer of the third photosensitive resin laminate. The same applies to a photosensitive layer of the n-th (n denotes an integer greater than 4) photosensitive resin laminate.

Lamination conditions may be appropriately set according to conventionally publicly known conditions.

Moreover, in order to increase a depth of each channel, i.e., a thickness of the photosensitive layer, lamination of the photosensitive resin laminate may be repeated a plurality of times. In this case, a support film of the photosensitive resin laminate laminated on the base material is stripped off, and a photosensitive resin laminate that is the same as the photosensitive resin laminate laminated on the base material, may be laminated on the exposed photosensitive resin composition layer.

<Light-Exposure Step (i-b) of Photosensitive Layer of First Photosensitive Laminate, Light-Exposure Step (ii-b) of Photosensitive Layer of Second Photosensitive Laminate, Light-Exposure Step (iii-b) of Photosensitive Layer of Third Photosensitive Laminate, and Light-Exposure Step (n-b) of Photosensitive Layer of N-th Photosensitive Laminate>

Following the lamination, a mask having a desired pattern of the partition member is brought into close contact on a support film of the photosensitive resin laminate and the photosensitive layer is exposed to light by using an active light source, or an image pattern corresponding to the desired pattern of the partition member is exposed to light by direct imaging exposure. As an exposure wavelength, i-line, h-line, g-line, a mixture thereof, etc., can be appropriately used. The exposure conditions may be appropriately set according to conventionally publicly known conditions.

Direct imaging exposure is desirable as a light-exposure method in terms of enabling forming of a microchannel having complicated shapes with high dimensional accuracy. Generally, in the direct imaging method, a large area is exposed to light by repeating an exposure of a minute exposure area or scanning the exposure area by using a digital micromirror device or a polygon mirror, etc. In this case, since the exposure time per unit area is shortened due to shortening of the exposure tact, the photosensitive resin layer is preferably highly sensitive. The highly photosensitive resin composition includes, for example, a radical negative photosensitive resin layer containing an alkali soluble polymer, an addition-polymerizable monomer, and a photopolymerization initiator. Such a negative photosensitive resin layer is preferably covered with a plastic film having low oxygen permeability and high transparency because the radical polymerization, i.e., curing reaction is inhibited by oxygen in the air during exposure to light. For these reasons, the photosensitive resin laminate is suitably used for the direct imaging exposure.

In one aspect thereof, carrying out alignment with an adjacent channel pattern layer by using a light-exposure apparatus having an alignment mechanism, is included. In this case, a desired pattern of the partition member and an alignment mark are exposed to light in the same plane of the photosensitive resin laminate, which enables alignment in a later step. As a result, it becomes possible to form a channel in which misalignment between layers is small, and to fabricate a microchannel with higher definition and excellent dimensional accuracy. Moreover, from the viewpoint of enabling to form a channel with higher definition and to facilitate to fabricate various channel shapes without a photomask, the light-exposure apparatus having an alignment mechanism is preferably a direct imaging exposure equipment having an alignment mechanism.

<Steps (i-c), (ii-c), (iii-c) and (n-c), of Developing Exposed Photosensitive Layer to Form Channel Pattern Layer>

After the exposure to light, a support film on the photosensitive resin layer is removed and the photosensitive layer is developed to form a plurality of partition members that consist of the cured resist film delimiting the microchannels. A developing solution is not particularly limited provided that it dissolves the unexposed portion of the photosensitive resin layer, and an alkaline aqueous solution is preferable. The alkaline aqueous solution such as $Na_2CO_3$ or $K_2CO_3$ aqueous solution is used. The alkaline aqueous solution is appropriately selected according to the characteristics of the photosensitive resin layer, and is generally a $Na_2CO_3$ aqueous solution having a concentration of about 0.2 to 2% by weight, which is used at about 20 to 40° C. The developing method includes known methods such as spraying, showering, oscillation-under-immersion, brushing, scrapping, etc.

For example, the minimum development time of a photosensitive layer of the first photosensitive resin laminate, the second photosensitive resin laminate, the third photosensitive resin laminate, or the n-th photosensitive resin laminate, per thickness of 25 μm of each layer in a 1% $Na_2CO_3$ aqueous solution at 30° C., can be 15 seconds to 50 seconds.

In one aspect, prior to the step of forming the lid member, step (i-d), step (ii-d), step (iii-d) or step (n-d), of washing with acid or divalent ion-containing water, respectively, may be further included after the step (i-c), the step (ii-c), the step (iii-c) or the step (n-c). After the development, the fluid resistance of the microchannel is improved by replacing the base of the alkaline aqueous solution remaining in the channel pattern with acid or divalent ions. Sulfuric acid or hydrochloric acid is used as acid. The divalent ion includes a magnesium ion and calcium ion. The acid or divalent ion-containing water generally has a concentration of about 0.1 to 20% by weight and is used at about 20 to 60° C. The cleaning method includes known methods such as spraying, showering, oscillation-under-immersion, brushing, scrapping, etc.

Moreover, prior to the step of forming the lid member, step (i-e), step (ii-e), step (iii-e) or step (n-e), of light-exposure step and/or heating step, respectively, can be further comprised after the step (i-d), the step (ii-d), the step (iii-d) or the step (n-d).

By further carrying out the light-exposure step and/or the heating step, the partition member and the lid member formed of the photosensitive resin composition layer are cured, and the fluid resistance of the microchannels is improved. The light-exposure step and/or the heating step are preferably subjected to a treatment at 40° C. to 200° C. and from the viewpoint of the manufacturing process, the heat treatment time is preferably 60 minutes or shorter. In the method of the light-exposure step and/or the heat treatment, a heating furnace employing hot air, infrared ray, far infrared ray, etc., which are used in appropriate methods, can be used, and the atmosphere in the light-exposure step and/or the heat treatment includes a $N_2$ atmosphere or $N_2/O_2$ atmosphere.

Finally, the step of forming a lid member can be carried out by laminating as the lid member a resin layer of a laminate composed of the support film and the resin layer on the second, third, or n-th channel pattern layer that is furthermost from the aforementioned substrate, respectively, so that each resin layer is in contact therewith.

The lid member can be maintained without stripping off the support film, and when the lid material has a protective film, the protective film is preferably stripped off to form a lid member. The lid member may also be a photosensitive resin laminate. In the technical field concerned, the lid member for the microchannel may often be referred to as a sealing material for the microchannel. The laminating apparatus includes a hot laminator, vacuum laminator, etc. Laminating conditions may be appropriately set according to conventionally publicly known conditions.

In one aspect, a light-exposure step can be further included following the step of forming the lid member. By carrying out this light-exposure step, the photosensitive resin composition layer is cured and the fluid resistance of the microchannel is improved. The exposure to light may be a pattern exposure or whole surface exposure, and the amount of exposure to light is preferably 100 mJ/cm$^2$ to 2,000 mJ/cm$^2$.

In the method for producing the multi-layered type microchannel device by using the photosensitive resin laminate of the present embodiment, a photosensitive resin laminate in film form can be used. When a liquid photosensitive resin composition is used and a base material having a concave-convex shape is coated with the composition by a spin coating method, etc., the first channel pattern layer is formed in a state where the concave portion is filled with the photosensitive resin composition, which is not preferred because faulty development, etc., take place in the following developing step. Moreover, the same applies when the second, third, or n-th channel pattern layer is formed.

EXAMPLES

The present invention will be specifically described below by way of Examples and Comparative Examples.

First, the evaluation method of the obtained samples will be described, then the methods for fabricating the evaluation samples of Examples and Comparative Examples will be described and the evaluation results thereon will be shown. In the following Table 1, the names of the material components in the compounding solutions of the photosensitive resin compositions and the compounding amounts (parts by weight on a solid content basis) in the compounding solutions of the resin compositions, are shown and the structures of the obtained multi-layered type microchannel devices, evaluation results, etc., are shown in Table 2 below.

[Fabrication of Evaluation Samples]

The evaluation samples in Examples and Comparative Examples were fabricated as follows.

<Fabrication of Photosensitive Resin Laminate 1>

The photosensitive resin laminate 1 was obtained by adding the photosensitive resin composition having the constitution of the photosensitive resin composition 1 shown in Table 1 below (it is noted that the numerals of the respective components indicate the compounding amounts (parts by weight) as solid contents) and ethanol as a solvent, sufficiently stirring and mixing them to prepare a compounding solution of the photosensitive resin composition, coating uniformly with it the surface of a polyethylene terephthalate film (FB40, manufactured by Toray Industries, Inc.) having a thickness of 16 μm as a support by using a bar coater and drying at 95° C. for 5 minutes, and then forming a photosensitive resin composition layer. The thickness of the photosensitive resin composition layer was 50 μm.

Next, GF-818 manufactured by Tamapoly Co., Ltd. was stuck as a protective film on the surface of the photosensitive resin composition layer on which the polyethylene terephthalate film was not laminated.

<Fabrication of Photosensitive Resin Laminate 2>

The photosensitive resin laminate 2 was obtained by adding the photosensitive resin composition having the constitution of the photosensitive resin composition 2 shown in Table 1 below (it is noted that the numerals of the respective components indicate the compounding amounts (parts by weight) as solid contents) and ethanol as a solvent, sufficiently stirring and mixing them to prepare a compounding solution of the photosensitive resin composition, coating uniformly with it the surface of a polyethylene terephthalate film (FB40, manufactured by Toray Industries, Inc.) having a thickness of 16 μm as a support by using a bar coater and drying, and then forming a photosensitive resin composition layer. The thickness of the photosensitive resin composition layer was 240 μm.

Next, GF-18 manufactured by Tamapoly Co., Ltd. was stuck as a protective film on the surface of the photosensitive resin composition layer on which the polyethylene terephthalate film was not laminated.

<Fabrication of Photosensitive Resin Laminate 3>

The photosensitive resin laminate 3 was obtained by adding the photosensitive resin composition having the constitution of the photosensitive resin composition 3 shown in Table 1 below (it is noted that the numerals of the respective components indicate the compounding amounts (parts by weight) as solid contents) and ethanol as a solvent, sufficiently stirring and mixing them to prepare a compounding solution of the photosensitive resin composition, coating uniformly with it the surface of a polyethylene terephthalate film (FB40, manufactured by Toray Industries, Inc.) having a thickness of 16 μm as a support by using a bar coater and drying, and then forming a photosensitive resin composition layer. The thickness of the photosensitive resin composition layer was 240 μm.

Next, GF-18 manufactured by Tamapoly Co., Ltd. was stuck as a protective film on the surface of the photosensitive resin composition layer on which the polyethylene terephthalate film was not laminated.

<Fabrication of Photosensitive Resin Laminate 4>

The photosensitive resin laminate 4 was obtained by adding the photosensitive resin composition having the constitution of the photosensitive resin composition 4 shown in Table 1 below (it is noted that the numerals of the respective components indicate the compounding amounts (parts by weight) as solid contents) and ethanol as a solvent, sufficiently stirring and mixing them to prepare a compounding solution of the photosensitive resin composition, coating uniformly with it the surface of a polyethylene terephthalate film (FB40, manufactured by Toray Industries, Inc.) having a thickness of 16 μm as a support by using a bar coater and drying at 95° C. for 5 minutes, and then forming a photosensitive resin composition layer. The thickness of the photosensitive resin composition layer was 50 μm.

Next, GF-818 manufactured by Tamapoly Co., Ltd. was stuck as a protective film on the surface of the photosensitive resin composition layer on which the polyethylene terephthalate film was not laminated.

<Fabrication of Photosensitive Resin Laminate 5>

The photosensitive resin laminate 5 was obtained by adding the photosensitive resin composition having the constitution of the photosensitive resin composition 5 shown in Table 1 below (it is noted that the numerals of the respective components indicate the compounding amounts (parts by weight) as solid contents) and ethanol as a solvent, sufficiently stirring and mixing them to prepare a compounding solution of the photosensitive resin composition, coating uniformly with it the surface of a polyethylene terephthalate film (FB40, manufactured by Toray Industries, Inc.) having a thickness of 16 μm as a support by using a bar coater and drying at 95° C. for 5 minutes, and then forming a photosensitive resin composition layer. The thickness of the photosensitive resin composition layer was 5 μm. Next, GF-18 manufactured by Tamapoly Co., Ltd. was stuck as a protective film on the surface of the photosensitive resin composition layer on which the polyethylene terephthalate film was not laminated.

TABLE 1

| Numerals in the Table denote compounding amounts as solid contents | | Photosensitive resin composition 1 | Photosensitive resin composition 2 | Photosensitive resin composition 3 | Photosensitive resin composition 4 | Photosensitive resin composition 5 |
|---|---|---|---|---|---|---|
| Base resin (B) | 35% by weight solid content methyl ethyl ketone solution of copolymer (weight-average molecular weight of 50,000) with composition: methacrylic acid/methyl methacrylate/butyl methacrylate (weight ratio: 25/50/25) | | | | 15 | |
| | 35% by weight solid content methyl ethyl ketone solution of copolymer (weight-average molecular weight of 50,000) with composition: styrene/methyl methaelylate/methaciylic acid (weight ratio: 25/65/10) | | | | 40 | |
| | 40% by weight solid content methyl ethyl ketone solution of copolymer (weight-average molecular weight of 55,000) with composition: methacrylic acid/benzyl methacrylate (weight ratio: 20/80) | 49 | | 50 | | |

TABLE 1-continued

| Numerals in the Table denote compounding amounts as solid contents | | Photosensitive resin composition 1 | Photosensitive resin composition 2 | Photosensitive resin composition 3 | Photosensitive resin composition 4 | Photosensitive resin composition 5 |
|---|---|---|---|---|---|---|
| Monomer (M) | 40% by weight solid content methyl ethyl ketone solution of copolymer (weight-average molecular weight of 70,000) with composition: methacrylic acid/benzyl methaerylate (weight ratio: 20/80) | | 55 | | 55 | |
| | 2,2-bis(4-((neth)acryloxypentaethoxy)eyelohexyl)propane | | | | 45 | |
| | Triacrylate having an average of 3 mol ethylene oxide added to trimethylolpropane | | 27 | 27 | | |
| | 2,2-bis(4-(methaeryloxypentacthoxy)phenyBpropane (NK Ester BPE-500 manufactured by Shin-Nakamura Chemical Co., Ltd.) | 15 | | | | |
| | Hexamethaervlate of polyalkylene glycol having an average of 13 mol ethylene oxide added to dipentacrythritol | 13 | | | | |
| | Dimethacrylate of polybutylene glycol having an average of 28 mol of added butvlene oxide | 7 | | | | |
| | Dimethacrylate of polyethylene glycol having an average of 4 mol of added ethylene oxide | | 4 | 4 | | |
| | Dimethacrylate of polyalkylene glycol having an average of 1 mol ethylene oxide each added to both ends of bisphenol A | | 4 | 4 | | |
| | 40% by weight solid content methyl ethyl ketone solution of dimethacrylate (weight-average molecular weight of 20,000) of polyurethane diol synthesized from polybutylene glycol having an average of 28 not of added butylene oxide and hexamethylenediamine | 50 | | | | 50 |
| Other components | 4,4'-bis(diethylamino)benzophenone | | 0.015 | 0.015 | | |
| | 2-(o-chlorophenyl)-4,5-diphenylimidazoly1 dimer | 5 | 3 | 3 | 5 | |
| | 1H-pyrazole,3-[1,1'-biphenyl]4-yl-5-[4-(1,1-dimethyl)phenyl]-4,5-dihydro-1-phenyl- | 0.2 | | | 0.2 | |
| | 9-phenylacridine | | | | | 0.4 |
| | N-phenylglycine | | | | | 0.2 |
| | Tribromomethyl phenyl sulfone | | | | | 0.7 |
| | Victoria Pure Blue | 0.01 | 0.01 | | 0.01 | |
| | Leuco crystal violet | 0.4 | 0.4 | | 0.4 | |
| | N-nitroso-N-phenylhydroxylamine aluminum | 0.01 | 0.01 | 0.01 | 0.01 | 0.01 |
| | Ethylenebis(oxyethylene)bis (3-5-tert-butyl-4-hydroxy-m-tolyl) propionate (product name IRGANOX 245) | | 0.05 | 0.05 | | |
| Total amount | | 89.62 | 93.485 | 93.075 | 105.62 | 101.31 |
| I(B + M)/O(B + M) | | 0.60 | 0.52 | 0.52 | 1.07 | 0.43 |

1. Calculation of I/O Value

The inorganic value (I) of each base resin (B) shown in Table 1 was calculated based on the organic conceptual diagram, and multiplied by the compounding amount (weight) shown in Table 1 to obtain a $B_{(I \times compounding\ amount)}$ value. Moreover, the organic value (O) is calculated and multiplied by the same compounding amount to obtain a $B_{(O \times compounding\ amount)}$ value.

The inorganic value (I) of each monomer (M) shown in Table 1 was also calculated based on the organic conceptual diagram, and multiplied by the compounding amount shown in Table 1 to obtain a $M_{(I \times compounding\ amount)}$ value. Further, the organic value (O) is calculated and multiplied by the compounding amount to calculate a $M_{(O \times compounding\ amount)}$ value.

The total value of the $B_{(I \times compounding\ amount)}$ values of all base resins (B) and the total value of the $M_{(I \times compounding\ amount)}$ values of all monomers (M) are summed up to obtain a summed $I_{(B+M)}$ value.

The total value of the $B_{(O \times compounding\ amount)}$ values of all base resins (B) and the total value of the $M_{(O \times compounding\ amount)}$ values of all monomers (M) are summed up to obtain a summed $O_{(B+M)}$ value.

The summed $I_{(B+M)}$ value of each of the photosensitive resin compositions 1 to 5 shown in Table 1, was divided by the summed $O_{(B+M)}$ value thereof to calculate $I_{(B+M)}/O_{(B+M)}$, to give a ratio (I/O).

As described above, the closer the ratio (I/O) comes to 0, the more non-polar (more hydrophobic and organic) an organic substance is, while the larger the ratio goes, the more polar (more hydrophilic and inorganic) an organic substance is. Thus, the polarities (large in hydrophilicity and inorganicity) of the photosensitive resin compositions 5, 2 (=3), 1 and 4 become higher in this order. Incidentally, a proportion between the ratios (I/O) of the photosensitive resin compositions is proportional to that between the ratios (I/O) of the corresponding cured resins.

2. Microchannel Misalignment Evaluation

Misalignment values of channels were judged according to the following evaluation criteria.

Good: The misalignment values in the width direction of the channel patterns of each layer were 20 μm or less when observed with an optical microscope.

Acceptable: The misalignment values in the width direction were 20 to 100 μm.

Poor: The misalignment values in the width direction exceeded 100 μm.

3. Microchannel Sealing Property Evaluation

The sealing property of microchannels was judged according to the following evaluation criteria.

Good: The microchannels were observed with an optical microscope, indicating that the channels were not clogged up and there observed no unnecessary air entrapment between the channel substrate surfaces and the photosensitive resin laminates. Therefore, the microchannels could be sealed successfully.

Acceptable: There partially observed clogging-up or air entrapment in the channels.

Poor: There observed clogging-up or air entrapment in the entire channel.

4. Microchannel Water Absorbency Evaluation

A hole was made from a sealing material side of a sample injection port, and 10 μL of ion-exchanged water was introduced from the hole. After 2 hours, a state of the ion-exchanged water was confirmed, and water absorbency was judged according to the following evaluation criteria.

Good: The ion-exchanged water has not been absorbed in the microchannels and almost remains.

Acceptable: The ion-exchanged water has been slightly absorbed in the microchannels and has been decreased.

Poor: The ion-exchanged water has been absorbed by the microchannels and has completely disappeared.

5. Meniscus Shape Evaluation of Microchannel Pattern

A hole was made from a sealing material side of a waste liquid section of a sample injection port, and 10 μL of ion-exchanged water was introduced from the hole. The sample was rotated at 1000 rpm for 10 seconds by using a rotating device, and the ion-exchanged water was delivered to weighing sections. A state of ion-exchanged water that was delivered to the weighing sections was observed, and the meniscus shape was judged according to the following evaluation criteria.

Remarkably good: The ion-exchanged water was delivered to all weighing sections, and the meniscus shapes of ion-exchanged water at all the inlets of the weighing sections are uniform.

Good: The ion-exchanged water was delivered to all weighing sections, and the meniscus shapes of the ion-exchanged water are uniform at the inlets except for a few of the weighing sections.

Acceptable: The ion-exchanged water was delivered to all weighing sections, however there is a variation in the meniscus shapes of the ion-exchanged water at the inlets of the weighing sections.

Poor: There observed some weighing sections where the ion-exchanged water was not delivered.

6. Microchannel Luminescence Detectability Evaluation

A luminescence experiment was carried out in channels by using a luminescence substrate SuperSignal™ West Femto. Microchannel luminescence detectability was judged according to the following evaluation criteria.

Remarkably good: Luminescence can be detected without any problem.

Good: Detection sensitivity is reduced due to an influence on luminescence contrast.

Acceptable: Detection sensitivity is reduced due to a large influence on luminescence contrast.

Poor: No luminescence can be detected.

Examples 1, 3 to 7: Channel Patterns Formed of Two-Layered Photosensitive Resin Laminates In Examples 1, 3 to 7 each, the protective film was stripped off and removed from the photosensitive resin laminate 1 and on a 6-inch and 3 mm-thick acrylic disk, the photosensitive resin composition layer having a thickness of 50 μm and the support film were laminated by using a normal pressure type laminator (VA-400III manufactured by Taisei Laminator Co., Ltd.) under the conditions of a speed of 0.2 m/min, cylinder pressure of 0.2 MPa and roll temperature of 70° C.

Figure 1:
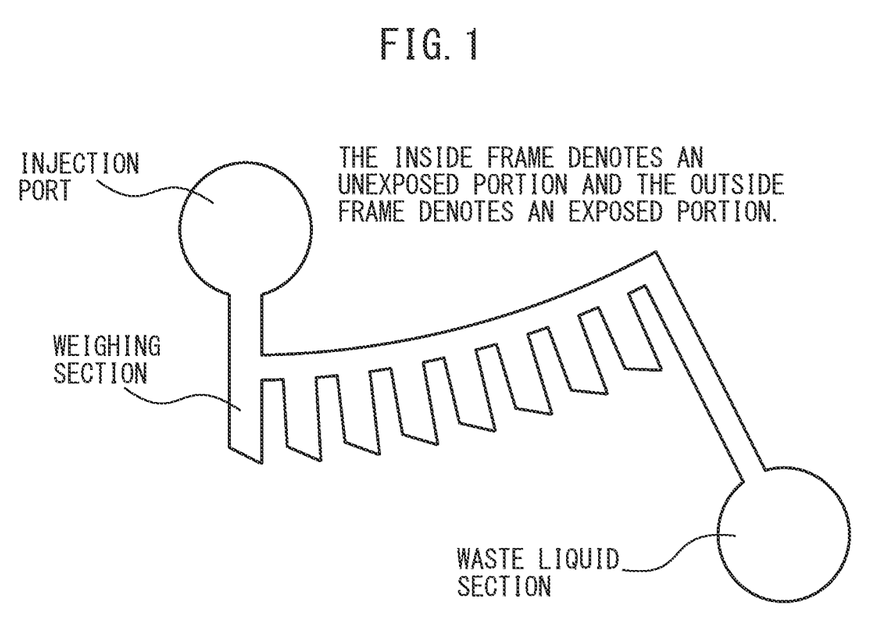
FIG. 1 is a view of the channel pattern used in Examples 1, 3 to 7 and Comparative Examples 1 and 2.

Then, the radially arranged 12 sets of the first channel patterns, the channel pattern of which is shown in FIG. 1 and a circular alignment mark having a diameter of 3 mm were exposed to light by using a Nuvogo fine 10 manufactured by Orbotech Japan Co., Ltd., at 60 mJ/cm$^2$ and an i-h line ratio of 30 to 70%.

Next, the supporting film was stripped off, and the channel patterns were developed by a conveyor type spray developing machine at 30° C. for 80 seconds by using a 1% sodium carbonate aqueous solution, washed with water and dried to obtain first channel patterns.

In Examples 1, 3 to 6, the protective films were stripped off and removed from the photosensitive resin laminate 2, and in Example 7 the protective film was stripped off and removed from the photosensitive resin laminate 3. The remaining 240 μm-thick photosensitive resin composition layers and the support films of the photosensitive resin laminates each were laminated only on the portion of the obtained first channel patterns except for the aforementioned circular alignment mark having a diameter of 3 mm by using a normal pressure type laminator (VA-400III manufactured by Taisei Laminator Co., Ltd.) under the conditions of a speed of 0.2 m/min., cylinder pressure of 0.2 MPa and roll temperature of 70° C.

Next, in Examples 1, 4 to 7 each, by using a Nuvogo fine 10 manufactured by Orbotech Japan Co., Ltd., the radially arranged 12 sets of the second channel patterns, the channel pattern of which is shown in FIG. 1 were exposed to light so as to overlap the first patterns fabricated above while carrying out an alignment by using the alignment mark at 400 mJ/cm$^2$ and an i-h line ratio of 0 to 100%.

In Example 3, a light-exposure machine HMW-801 manufactured by Oak Manufacturing Co., Ltd. was used as a light-exposure machine, and the channel patterns were exposed to light at 80 mJ/cm$^2$ while visually carrying out an alignment so that the first channel patterns and the exposed patterns overlap each other.

Next, the supporting film was stripped off, and development was carried out for 8 minutes by using a 1% sodium carbonate aqueous solution at 30° C. by a conveyor type spray developing machine, followed by washing with water and drying to obtain the second channel patterns.

In Examples 1, 3, 5 and 7, the channel patterns were each immersed in a 10% by weight sulfuric acid aqueous solution at 50° C. for 30 minutes, washed with water and dried (pickling), however, no pickling was carried out in Example 4.

Moreover, in Examples 1, 3, 4, 6, and 7, the channel patterns were subjected to curing treatment at 120° C. for 30 minutes in a hot air circulation type oven.

Then, in Examples 1, 3 to 5 and 7 each, the protective film was stripped off and removed from the photosensitive resin laminate 5 and the remaining 5 μm-thick photosensitive resin composition layer and the support film were stuck to the obtained channel patterns to laminate these by a vacuum laminator manufactured by Takatori Co., Ltd. at a degree of vacuum of 50 Pa and 70° C. After stuck together, the laminate was exposed to light at 500 mJ/cm$^2$ with a light-exposure machine HMW-201KB manufactured by Oak Manufacturing Co., Ltd. to complete sealing.

In Example 6, a single-sided adhesive tape for a diagnostic equipment application (#9964, manufactured by 3M Japan Limited) was used as a lid member, and stuck at a degree of vacuum of 50 Pa and 70° C. by a vacuum laminator manufactured by Takatori Co., Ltd. to complete sealing.

The thicknesses of the first channel pattern layer and the second channel pattern layer were 50 μm and 240 μm, respectively, and the aspect ratios were 0.25 and 1.2, respectively.

Example 2: Channel Patterns Formed of Three-Layered Photosensitive Resin Laminates In Example 2, the protective film was stripped off and removed from the photosensitive resin laminate 4 and on a 6-inch and 3 mm-thick acrylic disk, the photosensitive resin composition layer having a thickness of 50 μm and the support film were laminated by using a normal pressure type laminator (VA-400III manufactured by Taisei Laminator Co., Ltd.) under the conditions of a speed of 0.2 m/min., cylinder pressure of 0.2 MPa and roll temperature of 70° C.

Figure 2:
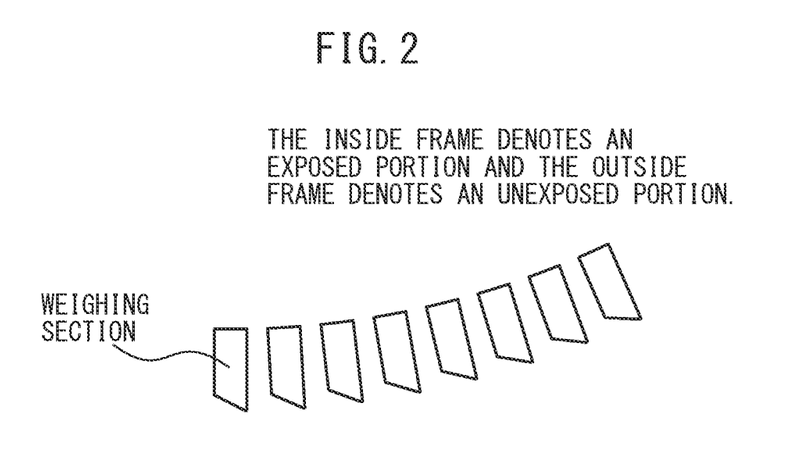
FIG. 2 is a view of the channel pattern further used in Example 2.

Then, the radially arranged 12 sets of the channel patterns, the channel pattern of which is shown in FIG. 2 and a circular alignment mark having a diameter of 3 mm were exposed to light by using a Nuvogo fine 10 manufactured by Orbotech Japan Co., Ltd., at 60 mJ/cm² and an i-h line ratio of 30 to 70%.

Next, the supporting film was stripped off, and the channel patterns were developed by a conveyor type spray developing machine at 30° C. for 80 seconds by using a 1% sodium carbonate aqueous solution, washed with water and dried to obtain first channel patterns.

In Example 2, the protective film was stripped off and removed from the photosensitive resin laminate 1, and the photosensitive resin composition layer having a thickness of 50 μm and the support film were laminated only on the portion of the obtained first channel patterns except for the aforementioned circular alignment mark having a diameter of 3 mm by using a normal pressure type laminator (VA-400III manufactured by Taisei Laminator Co., Ltd.) under the conditions of a speed of 0.2 m/min., cylinder pressure of 0.2 MPa and roll temperature of 70° C.

Next, by using a Nuvogo fine 10 manufactured by Orbotech Japan Co., Ltd., the radially arranged 12 sets of the second channel patterns, the channel pattern of which is shown in FIG. 1 were exposed to light so as to overlap the first patterns fabricated above while carrying out an alignment by using the alignment mark at 60 mJ/cm² and an i-h line ratio of 30 to 70%.

Subsequently, the supporting film was stripped off, and development was carried out for 80 seconds by using a 1% sodium carbonate aqueous solution at 30° C. by a conveyor type spray developing machine, followed by washing with water and drying to obtain the second channel patterns.

In Example 2, the protective film was stripped off and removed from the photosensitive resin laminate 2, and the remaining 240 μm-thick photosensitive resin composition layer and the support film were laminated only on the portion of the obtained second channel patterns except for the aforementioned circular alignment mark having a diameter of 3 mm by using a normal pressure type laminator (VA-400III manufactured by Taisei Laminator Co., Ltd.) under the conditions of a speed of 0.2 m/min., cylinder pressure of 0.2 MPa and roll temperature of 70° C.

Then, by using a Nuvogo fine 10 manufactured by Orbotech Japan Co., Ltd., the radially arranged 12 sets of the third channel patterns, the channel pattern of which is as well shown in FIG. 1 were exposed to light so as to overlap the second patterns fabricated above while carrying out an alignment with the alignment mark at 400 mJ/cm² and an i-h line ratio of 0 to 100%.

Next, the supporting film was stripped off, and development was carried out for 8 minutes by using a 1% sodium carbonate aqueous solution at 30° C. by a conveyor type spray developing machine, followed by washing with water and drying to obtain third channel patterns.

Subsequently, the channel patterns were immersed in a 10% by weight sulfuric acid aqueous solution at 50° C. for 30 minutes, washed with water and dried (pickling), and further cured at 120° C. for 30 minutes in a hot air circulation type oven.

Then, the protective film was stripped off and removed from the photosensitive resin laminate 5 and the remaining 5 μm-thick photosensitive resin composition layer and the support film were stuck to the obtained channel patterns to laminate these by a vacuum laminator manufactured by Takatori Co., Ltd. at a degree of vacuum of 50 Pa and 70° C. After stuck together, the laminate was exposed to light at 500 mJ/cm² with a light-exposure machine HMW-201KB manufactured by Oak Manufacturing Co., Ltd. to complete sealing.

The thicknesses of the first, second, and third channel pattern layers were 50 μm, 50 μm and 240 μm, respectively, and the aspect ratios were 0.25, 0.25, and 1.2, respectively.

Comparative Example 1. Channel Patterns Formed of Single-Layered Photosensitive Resin Laminate In Comparative Example 1, the protective film was stripped off and removed from the photosensitive resin laminate 2 and on a 6-inch and 3 mm-thick acrylic disk, the photosensitive resin composition layer having a thickness of 240 μm and the support film were laminated by using a normal pressure type laminator (VA-400III manufactured by Taisei Laminator Co., Ltd.) under the conditions of a speed of 0.2 m/min, cylinder pressure of 0.2 MPa and roll temperature of 70° C.

Then, the radially arranged 12 sets of the channel patterns, the channel pattern of which is shown in FIG. 1 were exposed to light at 80 mJ/cm² with a light-exposure machine HMW-801 manufactured by Oak Manufacturing Co., Ltd.

Next, the support film was peeled off, and development was carried out for 8 minutes by using a 1% sodium carbonate aqueous solution at 30° C. by a conveyor type spray developing machine, followed by washing with water and drying to obtain channel patterns.

Subsequently, the channel patterns were immersed in a 10% by weight sulfuric acid aqueous solution at 50° C. for 30 minutes, washed with water and dried (pickling), and further cured at 120° C. for 30 minutes in a hot air circulation type oven.

Then, the protective film was stripped off and removed from the aforementioned photosensitive resin laminate 5 and the remaining 5 μm-thick photosensitive resin composition layer and the support film were stuck to the obtained channel patterns to laminate these by a vacuum laminator manufactured by Takatori Co., Ltd. at a degree of vacuum of 50 Pa and 70° C. After stuck together, the laminate was exposed to light at 500 mJ/cm² with a light-exposure machine HMW-201KB manufactured by Oak Manufacturing Co., Ltd. to complete sealing.

The thickness of the first channel pattern layer was 240 µm, and the aspect ratio was 1.2.

Comparative Example 2: Channel Pattern by Injection Molding

In Comparative Example 2, the radially arranged 12 sets of acrylic resin microchannels (thickness of 240 µm and aspect ratio of 1.2), the channel pattern of which is shown in FIG. 1 were fabricated on a circular substrate by injection molding.

Next, the protective film was stripped off and removed from the aforementioned photosensitive resin laminate 5 and the remaining 5 µm-thick photosensitive resin composition layer and the support film were stuck to the obtained acrylic resin microchannels to laminate these by a vacuum laminator manufactured by Takatori Co., Ltd. at a degree of vacuum of 50 Pa and 70° C.

After stuck together, the laminate was exposed to light at 500 mJ/cm² with a light-exposure machine HMW-201KB manufactured by Oak Manufacturing Co., Ltd. to complete sealing.

Therefore, the present invention can be suitably used for producing a microchannel device.

The invention claimed is:

1. A method for producing a microchannel device comprising:
   (i) a step of sequentially carrying out step (i-a) of forming a first photosensitive resin layer on a substrate; step (i-b) of light-exposing the first photosensitive resin layer to obtain a light-exposed photosensitive layer of the first photosensitive resin layer, step (i-c) of developing the light-exposed photosensitive layer of the first photosensitive resin layer by using a first developing solution and forming a channel pattern layer, and step (i-d) of cleaning by acid or divalent ion-containing water, to form a first channel pattern layer; and
   (ii) a step of sequentially carrying out step (ii-a) of laminating a second photosensitive resin laminate on the first channel pattern layer formed in the step (i); step (ii-b) of light-exposing a photosensitive layer of the second photosensitive resin laminate to obtain a light-exposed photosensitive layer of the second photosensitive resin laminate; step (ii-c) of developing the light-exposed photosensitive layer of the second photosensitive resin laminate by using a second developing solution and forming a channel pattern layer, and step (ii-d) of cleaning by acid or divalent ion-containing water, to form a second channel pattern layer, wherein the first and second photosensitive resin layers comprise a carboxyl group- containing alkali soluble polymer (a), and the carboxyl group-containing alkali soluble polymer (a) has an acid equivalent of 100 to 600 and a weight-average molecular weight of 5,000 to 500,000, wherein the first developing solution and the second developing solution are an alkaline aqueous solution, and wherein the acid or divalent ion-containing water has a concentration of 0.1 to 20% by weight.

2. The method for producing a microchannel device according to claim 1, wherein the first photosensitive resin layer is formed by laminating a photosensitive resin laminate in the step (i-a).

TABLE 2

|  | Example 1 | Example 2 | Example 3 | Example 4 | Example 5 | Example 6 | Example 7 | Comparative Example 1 | Comparative Example 2 |
|---|---|---|---|---|---|---|---|---|---|
| Misalignment | Good | Good | Acceptable | Good | Good | Good | Good | — | — |
| Sealing property | Good | Good | Good | Good | Good | Acceptable | Acceptable | Good | Good |
| Water absorbency | Good | Acceptable | Good | Acceptable | Acceptable | Good | Good | Good | Good |
| Meniscus shape | Good | Remarkably good | Acceptable | Acceptable | Acceptable | Good | Good | Poor | Poor |
| Luminescence detection | Remarkably Good | Remarkably Acceptable | Good | Good | Good | Good | good | Good | good |
| First channel | Laminate 1 | Laminate 4 | Laminate 1 | Laminate 1 | Laminate 1 | Laminate 1 | Laminate 1 | Laminate 2 | Injection molding type |
| Second channel | Laminate 2 | Laminate 2 | Laminate 1 | Laminate 2 |  | Laminate 2 | Laminate 2 | Laminate 2 | Laminate 3 |
| Third channel | Laminate 2 | — | — | — | — | — | — | — | — |
| Sealing material | Laminate 5 | Laminate 5 | Laminate 5 | Laminate 5 | Laminate 5 | #9964 | Laminate 5 | Laminate 5 | Laminate 5 |
| Exposure to light | Nuvogo fine 10 | Nuvogo o fine 10 | HMW-801 | Nuvogo o fine 10 | Nuvogo o fine 10 | Nuvogo o fine 10 | Nuvogo o fine 10 | HMW-801 | — |
| Pickling treatment | With treatment | With treatment | With treatment | Without treatment | With treatment | With treatment | With treatment | With treatment | — |
| Curing | Cured | Cured | Cured | Cured | Without curing | Cured | Cured | Cured | — |

INDUSTRIAL APPLICABILITY

According to the method for producing a microchannel device of the present invention, a multi-layered type microchannel device that is highly-defined and excellent in dimension accuracy and also enables channels thereof to be partially hydrophilized or hydrophobilized, can be easily produced. The method for producing the microchannel device of the present invention enables to easily design the characteristic properties (water resistance, organic solvent resistance, mechanical characteristics, etc.) of the structural members by using the photosensitive resin laminate (also referred to as a dry film resist or dry film photoresist) having the photosensitive resin composition that is a liquid resist and/or a supporting film as well as the photosensitive resin composition layer, or by changing a composition of the photosensitive resin composition, further enables to carry out analysis, chemical reaction, etc., with high accuracy by appropriately controlling resistance to fluids in accordance to applications, and also enables to be excellent in dimensional accuracy without metal molds, etc., as essentials (i.e., with fewer equipment and less cost) since the photosensitive resin laminate can be subjected to a pattern light-exposure.

3. The method for producing a microchannel device according to claim 2, wherein the second channel pattern layer is different from the first channel pattern layer in terms of wettability.

4. The method for producing a microchannel device according to claim 2, further comprising:
- (iii) a step of sequentially carrying out step (iii-a) of laminating a third photosensitive resin laminate on the second channel pattern layer formed in the step (ii); step (iii-b) of light-exposing a photosensitive layer of the third photosensitive resin laminate to obtain a light-exposed photosensitive layer of the third photosensitive resin laminate; and step (iii-c) of developing the light-exposed photosensitive layer of the third photosensitive resin laminate and forming a channel pattern layer, to form a third channel pattern layer.

5. The method for producing a microchannel device according to claim 1, wherein the second channel pattern layer is different from the first channel pattern layer in terms of wettability.

6. The method for producing a microchannel device according to claim 1, further comprising:
- (iii) a step of sequentially carrying out step (iii-a) of laminating a third photosensitive resin laminate on the second channel pattern layer formed in the step (ii); step (iii-b) of light-exposing a photosensitive layer of the third photosensitive resin laminate to obtain a light-exposed photosensitive layer of the third photosensitive resin laminate; and step (iii-c) of developing the light-exposed photosensitive layer of the third photosensitive resin laminate and forming a channel pattern layer, to form a third channel pattern layer,
wherein the third photosensitive resin laminate comprises the carboxyl group-containing alkali soluble polymer (a), and the carboxyl group-containing alkali soluble polymer (a) has an acid equivalent of 100 to 600 and a weight-average molecular weight of 5,000 to 500,000.

7. The method for producing a microchannel device according to claim 6, wherein the third channel pattern layer is different from the second channel pattern layer in terms of wettability.

8. The method for producing a microchannel device according to claim 6, further comprising:
- (n) repeated steps of sequentially carrying out step (n-a) of laminating a n-th photosensitive resin laminate on a (n−1)-th channel pattern layer wherein n is an integer of at least 4;
step (n-b) of light-exposing a photosensitive layer of the n-th photosensitive resin laminate to obtain a light-exposed photosensitive layer of the n-th photosensitive resin laminate; and step (n-c) of developing the light-exposed photosensitive layer of the n-th photosensitive resin laminate and forming a channel pattern layer, to form a n-th channel pattern layer,
wherein the n-th photosensitive resin laminate comprises the carboxyl group-containing alkali soluble polymer (a), and the carboxyl group-containing alkali soluble polymer (a) has an acid equivalent of 100 to 600 and a weight-average molecular weight of 5,000 to 500,000.

9. The method for producing a microchannel device according to claim 8, wherein the n-th channel pattern layer is different from the (n−1)-th channel pattern layer in terms of wettability.

10. The method for producing a microchannel device according to claim 8, further comprising the step (i-d), the step (ii-d), a step (iii-d) or a step (n-d), of cleaning by acid or divalent ion-containing water, respectively following the step (i-c), the step (ii-c), the step (iii-c) or the step (n-c).

11. The method for producing a microchannel device according to claim 10, further comprising step (i-e), step (ii-e), step (iii-e) or step (n-e), of exposure to light and/or heating, respectively following the step (i-d), the step (ii-d), the step (iii-d) or the step (n-d).

12. The method for producing a microchannel device according to claim 6, further comprising the step (i-d), the step (ii-d) or a step (iii-d) of cleaning by acid or divalent ion-containing water, respectively following the step (i-c), the step (ii-c) or the step (iii-c).

13. The method for producing a microchannel device according to claim 12, further comprising step (i-e), step (ii-e) or step (iii-e), of exposure to light and/or heating, respectively following the step (i-d), the step (ii-d) or the step (iii-d).

14. The method for producing a microchannel device according to claim 1, wherein alignment is carried out between adjacent channel pattern layers by using a light-exposure apparatus with alignment mechanism in the step (ii-b).

15. The method for producing a microchannel device according to claim 14, wherein the light-exposure apparatus with alignment mechanism is a direct imaging exposure equipment.

16. The method for producing a microchannel device according to claim 1, further comprising a step of forming a lid member on a second or third or n-th channel pattern layer furthermost from the substrate by laminating as the lid member a resin layer of a laminate consisting of a support film and the resin layer so as to contact the second or third or (n−1)-th channel pattern layer.

17. The method for producing a microchannel device according to claim 16, further comprising a step of exposure to light following the step of forming the lid member.

18. The method for producing a microchannel device according to claim 1, wherein a transmission ratio at either or both of a wavelength of 515 nm and a wavelength of 600 nm is 80% or greater in the first channel pattern layer or the second channel pattern layer.

19. The method for producing a microchannel device according to claim 1, wherein a minimum developing time is 15 seconds to 50 seconds in a 1% $Na_2CO_3$ aqueous solution at 30° C.per 25 μm thickness of the first photosensitive resin layer or the photosensitive layer of the second photosensitive resin laminate.

20. The method for producing a microchannel device according to claim 1, wherein the first channel pattern layer or the second channel pattern layer has a layer thickness of 50 μm or greater and a pattern having an aspect ratio of 1.2 or greater.

21. The method for producing a microchannel device according to claim 1, further comprising step (i-e) or step (ii-e), of exposure to light and/or heating, respectively following the step (i-d) or the step (ii-d).

22. The method for producing a microchannel device according to claim 1, further comprising a step of forming a single lid member on the second or third or n-th channel pattern layer furthermost from the substrate by laminating as the single lid member another photosensitive resin layer of a photosensitive laminate consisting of a support film and the photosensitive resin layer so as to contact the second or third or n-th channel pattern layer.

23. The method for producing a microchannel device according to claim 22, further comprising a step of exposure to light following the step of forming the lid member.

* * * * *